US 6,936,491 B2

(12) United States Patent
Partridge et al.

(10) Patent No.: US 6,936,491 B2
(45) Date of Patent: Aug. 30, 2005

(54) METHOD OF FABRICATING MICROELECTROMECHANICAL SYSTEMS AND DEVICES HAVING TRENCH ISOLATED CONTACTS

(75) Inventors: Aaron Partridge, Palo Alto, CA (US); Markus Lutz, Palo Alto, CA (US); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 7 days.

(21) Appl. No.: 10/455,555

(22) Filed: Jun. 4, 2003

(65) Prior Publication Data
US 2004/0245586 A1 Dec. 9, 2004

(51) Int. Cl.[7] ............................................. H01L 21/00
(52) U.S. Cl. ............................. 438/48; 438/50; 438/52
(58) Field of Search ..................................... 438/48–52

(56) References Cited

U.S. PATENT DOCUMENTS

| | | | |
|---|---|---|---|
| 4,665,610 A | 5/1987 | Barth | |
| 4,674,319 A | 6/1987 | Muller et al. | |
| 4,766,666 A | 8/1988 | Sugiyama et al. | |
| 4,849,071 A | 7/1989 | Evans et al. | |
| 4,945,769 A | 8/1990 | Sidner et al. | |
| 4,990,462 A | 2/1991 | Sliwa, Jr. | |
| 5,075,253 A | 12/1991 | Sliwa, Jr. | |
| 5,139,624 A | 8/1992 | Searson et al. | |
| 5,156,903 A | 10/1992 | Okumura et al. | |
| 5,338,416 A | 8/1994 | Mlcak et al. | |
| 5,445,991 A | 8/1995 | Lee | |
| 5,455,547 A | 10/1995 | Lin et al. | |
| 5,461,916 A | 10/1995 | Fujii et al. | |
| 5,470,797 A | 11/1995 | Mastrangelo | |
| 5,491,604 A | 2/1996 | Nguyen et al. | |
| 5,504,026 A | 4/1996 | Kung | |
| 5,510,156 A | 4/1996 | Zhao | |

(Continued)

FOREIGN PATENT DOCUMENTS

| | | |
|---|---|---|
| EP | 0 451 992 | 10/1991 |
| EP | 1 217 735 | 6/2002 |
| GB | 2 198 611 | 6/1988 |
| WO | WO 97/49475 | 12/1997 |
| WO | WO 01/46066 | 6/2001 |
| WO | WO 01/77008 | 10/2001 |
| WO | WO 01/77009 | 10/2001 |

OTHER PUBLICATIONS

"Sealed Vacuum Electronic Devices by Surface Micromachining", Zurn et al., IEEE IEDM 91, Sep. 1991, pp. 205–208.

(Continued)

Primary Examiner—Thanh Nguyen
(74) Attorney, Agent, or Firm—Neil A. Steinberg

(57) ABSTRACT

There are many inventions described and illustrated herein. In one aspect, the present invention is directed to a MEMS device, and technique of fabricating or manufacturing a MEMS device, having mechanical structures encapsulated in a chamber prior to final packaging and a contact area disposed at least partially outside the chamber. The contact area is electrically isolated from nearby electrically conducting regions by way of dielectric isolation trench that is disposed around the contact area. The material that encapsulates the mechanical structures, when deposited, includes one or more of the following attributes: low tensile stress, good step coverage, maintains its integrity when subjected to subsequent processing, does not significantly and/or adversely impact the performance characteristics of the mechanical structures in the chamber (if coated with the material during deposition), and/or facilitates integration with high-performance integrated circuits. In one embodiment, the material that encapsulates the mechanical structures is, for example, silicon (polycrystalline, amorphous or porous, whether doped or undoped), silicon carbide, silicon-germanium, germanium, or gallium-arsenide.

27 Claims, 26 Drawing Sheets

U.S. PATENT DOCUMENTS

| | | |
|---|---|---|
| 5,517,123 A | 5/1996 | Zhao et al. |
| 5,537,083 A | 7/1996 | Lin et al. |
| 5,540,095 A | 7/1996 | Sherman et al. |
| 5,583,290 A | 12/1996 | Lewis |
| 5,589,082 A | 12/1996 | Lin et al. |
| 5,604,312 A | 2/1997 | Lutz |
| 5,613,611 A | 3/1997 | Johnson et al. |
| 5,616,514 A | 4/1997 | Muchow et al. |
| 5,620,931 A | 4/1997 | Tsang et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,640,039 A | 6/1997 | Chau et al. |
| 5,679,436 A | 10/1997 | Zhao |
| 5,683,591 A | 11/1997 | Offenberg |
| 5,703,293 A | 12/1997 | Zabler et al. |
| 5,721,377 A | 2/1998 | Kurle et al. |
| 5,723,353 A | 3/1998 | Muenzel et al. |
| 5,728,936 A | 3/1998 | Lutz |
| 5,751,041 A | 5/1998 | Suzuki et al. |
| 5,760,455 A | 6/1998 | Hierold et al. |
| 5,761,957 A | 6/1998 | Oba et al. |
| 5,804,083 A | 9/1998 | Ishii et al. |
| 5,818,227 A | 10/1998 | Payne et al. |
| 5,839,062 A | 11/1998 | Nguyen et al. |
| 5,847,280 A | 12/1998 | Sherman et al. |
| 5,858,809 A | 1/1999 | Chau et al. |
| 5,872,024 A | 2/1999 | Fujii et al. |
| 5,880,369 A | 3/1999 | Samuels et al. |
| 5,889,207 A | 3/1999 | Lutz |
| 5,898,218 A | 4/1999 | Hirose et al. |
| 5,919,364 A | 7/1999 | Lebouitz et al. |
| 5,922,212 A | 7/1999 | Kano et al. |
| 5,937,275 A | 8/1999 | Münzel et al. |
| 5,948,991 A | 9/1999 | Nomura et al. |
| 5,955,932 A | 9/1999 | Nguyen et al. |
| 5,959,208 A | 9/1999 | Muenzel et al. |
| 5,969,249 A | 10/1999 | Roessig et al. |
| 5,986,316 A | 11/1999 | Toyoda et al. |
| 5,987,989 A | 11/1999 | Yamamoto et al. |
| 5,992,233 A | 11/1999 | Clark |
| 6,009,753 A | 1/2000 | Tsang et al. |
| 6,028,332 A | 2/2000 | Kano et al. |
| 6,035,714 A | 3/2000 | Yazdi et al. |
| 6,048,774 A | 4/2000 | Yamamoto et al. |
| 6,055,858 A | 5/2000 | Muenzel et al. |
| 6,065,341 A | 5/2000 | Ishio et al. |
| 6,067,858 A | 5/2000 | Clark et al. |
| 6,090,718 A | 7/2000 | Soga et al. |
| 6,100,108 A | 8/2000 | Mizuno et al. |
| 6,106,735 A | 8/2000 | Kurle et al. |
| 6,117,701 A | 9/2000 | Buchan et al. |
| 6,119,518 A | 9/2000 | Itou et al. |
| 6,122,964 A | 9/2000 | Mohaupt et al. |
| 6,125,700 A | 10/2000 | Tsugai et al. |
| 6,140,709 A | 10/2000 | Muenzel et al. |
| 6,142,358 A | 11/2000 | Cohn et al. |
| 6,146,917 A | 11/2000 | Zhang et al. |
| 6,147,756 A | 11/2000 | Zavracky et al. |
| 6,149,190 A | 11/2000 | Galvin et al. |
| 6,151,966 A | 11/2000 | Sakai et al. |
| 6,153,839 A | 11/2000 | Zavracky et al. |
| 6,156,652 A | 12/2000 | Michalicek |
| 6,163,643 A | 12/2000 | Bergmann et al. |
| 6,170,332 B1 | 1/2001 | MacDonald et al. |
| 6,171,881 B1 | 1/2001 | Fujii |
| 6,187,210 B1 | 2/2001 | Lebouitz et al. |
| 6,187,607 B1 | 2/2001 | Offenberg et al. |
| 6,191,007 B1 | 2/2001 | Matsui et al. |
| 6,192,757 B1 | 2/2001 | Tsang et al. |
| 6,199,430 B1 | 3/2001 | Kano et al. |
| 6,199,874 B1 | 3/2001 | Galvin et al. |
| 6,204,085 B1 | 3/2001 | Strumpell et al. |
| 6,210,988 B1 | 4/2001 | Howe et al. |
| 6,214,243 B1 | 4/2001 | Muenzel et al. |
| 6,218,717 B1 | 4/2001 | Toyoda et al. |
| 6,227,049 B1 | 5/2001 | Fujii |
| 6,227,050 B1 | 5/2001 | Fujii et al. |
| 6,230,567 B1 | 5/2001 | Greiff |
| 6,233,811 B1 | 5/2001 | Payne et al. |
| 6,236,281 B1 | 5/2001 | Nguyen et al. |
| 6,240,782 B1 | 6/2001 | Kato et al. |
| 6,244,112 B1 | 6/2001 | Fujii |
| 6,245,593 B1 | 6/2001 | Yoshihara et al. |
| 6,249,073 B1 | 6/2001 | Nguyen et al. |
| 6,250,156 B1 | 6/2001 | Seshia et al. |
| 6,250,165 B1 | 6/2001 | Sakai et al. |
| 6,251,754 B1 | 6/2001 | Ohshima et al. |
| 6,255,741 B1 | 7/2001 | Yoshihara et al. |
| 6,264,363 B1 | 7/2001 | Takahashi et al. |
| 6,274,452 B1 | 8/2001 | Miura et al. |
| 6,275,034 B1 | 8/2001 | Tran et al. |
| 6,276,207 B1 | 8/2001 | Sakai et al. |
| 6,279,585 B1 | 8/2001 | Shiraki et al. |
| 6,282,960 B1 | 9/2001 | Samuels et al. |
| 6,284,670 B1 | 9/2001 | Abe et al. |
| 6,287,885 B1 | 9/2001 | Muto et al. |
| 6,291,315 B1 | 9/2001 | Nakayama et al. |
| 6,291,875 B1 | 9/2001 | Clark et al. |
| 6,296,779 B1 | 10/2001 | Clark et al. |
| 6,297,072 B1 | 10/2001 | Tilmans et al. |
| 6,300,294 B1 | 10/2001 | Robbins et al. |
| 6,307,815 B1 | 10/2001 | Polosky et al. |
| 6,308,567 B1 | 10/2001 | Higuchi et al. |
| 6,311,555 B1 | 11/2001 | McCall et al. |
| 6,315,062 B1 | 11/2001 | Alft et al. |
| 6,318,175 B1 | 11/2001 | Muchow et al. |
| 6,323,550 B1 | 11/2001 | Martin et al. |
| 6,325,886 B1 | 12/2001 | Harris et al. |
| 6,352,935 B1 | 3/2002 | Collins et al. |
| 6,373,007 B1 | 4/2002 | Calcatera et al. |
| 6,378,989 B1 | 4/2002 | Silverbrook |
| 6,386,032 B1 | 5/2002 | Lemkin et al. |
| 6,388,279 B1 | 5/2002 | Sakai et al. |
| 6,389,899 B1 | 5/2002 | Partridge et al. |
| 6,389,903 B1 | 5/2002 | Oba et al. |
| 6,392,144 B1 | 5/2002 | Filter et al. |
| 6,396,711 B1 | 5/2002 | Degani et al. |
| 6,402,968 B1 | 6/2002 | Yazdi et al. |
| 6,416,831 B1 | 7/2002 | Hara et al. |
| 6,422,078 B2 | 7/2002 | Imai |
| 6,423,563 B2 | 7/2002 | Fukada et al. |
| 6,424,074 B2 | 7/2002 | Nguyen |
| 6,429,506 B1 | 8/2002 | Fujii et al. |
| 6,429,755 B2 | 8/2002 | Speidell et al. |
| 6,433,401 B1 | 8/2002 | Clark et al. |
| 6,433,411 B1 | 8/2002 | Degani et al. |
| 6,437,551 B1 | 8/2002 | Krulevitch et al. |
| 6,440,766 B1 | 8/2002 | Clark |
| 6,441,481 B1 | 8/2002 | Karpman |
| 6,443,008 B1 | 9/2002 | Funk et al. |
| 6,444,543 B2 | 9/2002 | Sakai et al. |
| 6,448,109 B1 | 9/2002 | Karpman |
| 6,448,604 B1 | 9/2002 | Funk et al. |
| 6,448,622 B1 | 9/2002 | Franke et al. |
| 6,449,406 B1 | 9/2002 | Fan et al. |
| 6,460,234 B1 | 10/2002 | Gianchandani |
| 6,462,566 B1 | 10/2002 | Schoefthaler et al. |
| 6,463,803 B2 | 10/2002 | Fujii et al. |
| 6,465,281 B1 | 10/2002 | Xu et al. |
| 6,472,290 B2 | 10/2002 | Cho et al. |

| | | | |
|---|---|---|---|
| 6,477,901 B1 | 11/2002 | Tadigadapa et al. | |
| 6,478,974 B1 | 11/2002 | Lebouitz et al. | |
| 6,483,957 B1 | 11/2002 | Hamerly et al. | |
| 6,495,389 B2 | 12/2002 | Ishio et al. | |
| 6,507,044 B1 | 1/2003 | Santana, Jr. et al. | |
| 6,507,082 B2 | 1/2003 | Thomas | |
| 6,508,124 B1 | 1/2003 | Zerbini et al. | |
| 6,508,126 B2 | 1/2003 | Sakai et al. | |
| 6,508,561 B1 | 1/2003 | Alie et al. | |
| 6,512,255 B2 | 1/2003 | Aoki et al. | |
| 6,521,508 B1 | 2/2003 | Cheong et al. | |
| 6,521,965 B1 | 2/2003 | Lutz | |
| 6,522,052 B2 | 2/2003 | Kihara et al. | |
| 6,524,890 B2 | 2/2003 | Ueda et al. | |
| 6,531,767 B2 | 3/2003 | Shrauger | |
| 6,534,340 B1 | 3/2003 | Karpman et al. | |
| 6,550,331 B2 | 4/2003 | Fujii et al. | |
| 6,550,339 B1 | 4/2003 | Toyoda et al. | |
| 6,551,853 B2 | 4/2003 | Toyoda | |
| 6,552,404 B1 | 4/2003 | Hynes et al. | |
| 6,555,417 B2 | 4/2003 | Spooner et al. | |
| 6,555,901 B1 | 4/2003 | Yoshihara et al. | |
| 6,555,904 B1 | 4/2003 | Karpman | |
| 6,558,976 B2 | 5/2003 | Shrauger | |
| 6,621,134 B1 | 9/2003 | Zurn | |
| 6,624,726 B2 | 9/2003 | Niu et al. | |
| 6,635,509 B1 * | 10/2003 | Ouellet | 438/106 |
| 6,808,954 B2 | 10/2004 | Ma et al. | |
| 2001/0001931 A1 | 5/2001 | Fuji et al. | |
| 2001/0009110 A1 | 7/2001 | Tmal | |
| 2001/0034076 A1 | 10/2001 | Martin | |
| 2002/0016058 A1 * | 2/2002 | Zhao | 438/619 |
| 2002/0135047 A1 | 9/2002 | Funk et al. | |
| 2003/0215974 A1 * | 11/2003 | Kawasaki et al. | 438/50 |
| 2004/0016989 A1 | 1/2004 | Ma et al. | |
| 2004/0065932 A1 * | 4/2004 | Reichenbach et al. | 257/415 |

OTHER PUBLICATIONS

"Permeable Polysilicon Etch–Access Windows for Microshell Fabrication", Lebouitz K S et al., International Conference on Solid–State Sensors and Actuators and Eurosensors, Jun. 25, 1995, pp. 224–227.

"Porous Polycrystalline Silicon: A New Material for MEMS", Anderson R C et al., Journal of Microelectromechanical Systems, Mar. 1994, USA, vol. 3, No. 1, pp. 10–18.

"Vacuum Encapsulation of Resonant Devices Using Permeable Polysilicon", Lebouitz et al., 1999 IEEE, pp. 470–475.

"Laterally Grown Porous Polycrystalline Silicon: A New Material for Transducer Applications", Anderson et al., 1991 IEEE, pp. 747–750.

"Vacuum Sealing of Microcavities Using Metal Evaporation", Bartek et al., Sensors and Actuators A 61, 1997, pp. 364–368.

"Vacuum Packaging Technology Using Localized Aluminum/Silicon–to–Glass Bonding", Cheng et al., MEMS 2001, $14^{th}$ IEEE International Conference, pp. 18–21.

"A Hermetic Glass–Silicon Package Formed Using Localized Aluminum/Silicon–Glass Bonding", Cheng et al., Journal of Microelectromechanical Systems, vol. 10, No. 3, Sep. 2001, pp. 392–399.

"MEMS Post–Packaging by Localized Heating and Bonding", Lin, IEEE Transactions on Advanced Packaging, vol. 23, No. 4, Nov. 2000, pp. 608–616.

"Localized Silicon Fusion and Eutectic Bonding for MEMS Fabrication and Packaging", Cheng et al., Journal of Microelectromechanical Systems, vol. 9, No. 1, Mar. 2000, pp. 3–8.

"Localized Bonding with PSG or Indium Solder as Intermediate Layer", Cheng et al., MEMS 1999, $12^{th}$ IEEE International Conference, pp. 285–289.

"Vacuum encapsulation of resonant devices using permeable polysilicon", Lebouitz et al., Micro Electro Mechanical Systems, IEEE International Conference, Jan. 1999, pp. 470–475.

"Electrical and optical characteristics of vacuum–sealed polysilicon microlamps", Mastrangelo et al., IEEE Transactions on Electron Devices, v.39, No. 6, Jun. 1992, pp. 1363–1375.

"Vacuum–sealed silicon micromachined incandescent light source", Mastrangelo et al., IEDM, 1989, pp. 503–506.

"Sealing of Micromachined Cavities Using Chemical Vapor Deposition Methods: Characterization and Optimization", Liu and Tai, IEEE Journal of Microelectromechanical Systems, vol. 8, No. 2, Jun. 1999, pp. 135–145.

"Vacuum Packaging Technology Using Localized Aluminum/Silicon–to–Glass Bonding", Cheng et al., IEEE Journal of Microelectromechanical Systems, vol. 11, No. 5, Oct. 2002, pp. 556–565.

"Novel Process for a Monolithic Integrated Accelerometer", Offenberg et al., The $8^{th}$ International Conference on Solid–State Sensors and Actuators, and Eurosensors IX, Stockholm, Sweden, Jun. 25–29, 1995, pp. 589–592.

"An Integrated Wafer–Scale Packaging Process for MEMS", Kenny et al., Proceedings of IMECE2002, ASME International Mechanical Engineering Congress & Exposition, Nov. 17–22, 2002, New Orleans, Louisiana, pp. 51–54.

"Polysilicon Vibrating Gyroscope Vacuum–Encapsulated in an on–chip Micro Chamber", Tsuchiya et al., Sensors and Actuators A 90 (2001), pp. 49–55.

"New Thin Film Epitaxial Polysilicon Encapsulation for Piezoresistive Accelerometers", Partridge et al., IEEE, 2001, pp. 54–59.

"A Low Temperature Bi–CMOS Compatible Process for MEMS RF Resonators and Filters", Lund et al., Solid–State Sensor, Actuator and Microsystems Workshop, Hilton Head Island, South Carolina, Jun. 2–6, 2002, pp. 38–41.

"Wafer Scale Encapsulation of a High–Q Micromechanical Resonator", Candler et al., Hilton Head, Open Poster, 2002.

* cited by examiner

US 6,936,491 B2

METHOD OF FABRICATING MICROELECTROMECHANICAL SYSTEMS AND DEVICES HAVING TRENCH ISOLATED CONTACTS

BACKGROUND

This invention relates to electromechanical systems and techniques for fabricating microelectromechanical and nanoelectromechanical systems; and more particularly, in one aspect, to fabricating or manufacturing microelectromechanical and nanoelectromechanical systems with high performance integrated circuits on a common substrate.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

The mechanical structures are typically sealed in a chamber. The delicate mechanical structure may be sealed in, for example, a hermetically sealed metal container (for example, a TO-8 "can", see, for example, U.S. Pat. No. 6,307,815) or bonded to a semiconductor or glass-like substrate having a chamber to house, accommodate or cover the mechanical structure (see, for example, U.S. Pat. Nos. 6,146,917; 6,352,935; 6,477,901; and 6,507,082). In the context of the hermetically sealed metal container, the substrate on, or in which, the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

MEMS that employ a hermetically sealed metal container or a bonded semiconductor or glass-like substrate to protect the mechanical structures tend to be difficult to cost effectively integrate with high performance integrated circuitry on the same substrate. In this regard, the additional processing required to integrate the high performance integrated circuitry, tends to either damage or destroy the mechanical structures.

Another technique for forming the chamber that protects the delicate mechanical structure employs micromachining techniques. (See, for example, International Published Patent Applications Nos. WO 01/77008 A1 and WO 01/77009 A1). In this regard, the mechanical structure is encapsulated in a chamber using a conventional oxide ($SiO_2$) deposited or formed using conventional techniques (i.e., oxidation using low temperature techniques (LTO), tetraethoxysilane (TEOS) or the like). (See, for example, WO 01/77008 A1, FIGS. 2–4). When implementing this technique, the mechanical structure is encapsulated prior to packaging and/or integration with integrated circuitry.

While employing a conventional oxide to encapsulate the mechanical structures of the MEMS may provide advantages relative to hermetically sealed metal container or a bonded semiconductor or glass-like substrate, a conventional oxide, deposited using conventional techniques, often exhibits high tensile stress at, for example, corners or steps (i.e., significant spatial transitions in the underlying surface (s)). Further, such an oxide is often formed or deposited in a manner that provides poor coverage of those areas where the underlying surface(s) exhibit significant spatial transitions. In addition, a conventional oxide (deposited using conventional techniques) often provides an insufficient vacuum where a vacuum is desired as the environment in which the mechanical structures are encapsulated and designed to operate. These shortcomings may impact the integrity and/or performance of the MEMS.

Moreover, a conventional oxide, deposited using conventional techniques, may produce a film on the mechanical structures during the encapsulation process. This film may impact the integrity of the mechanical structures and, as such, the performance or operating characteristics of the MEMS (for example, the operating characteristics of a resonator).

There is a need for, among other things, MEMS (for example, gyroscopes, resonators, temperature sensors and/or accelerometers) that (1) overcome one, some or all of the shortcomings of the conventional materials and techniques and/or (2) may be efficiently integrated on a common substrate with high performance integrated circuits and/or additional MEMS.

SUMMARY OF THE INVENTION

There are many inventions described and illustrated herein. In a first principal aspect, the present invention is a method of sealing a chamber of an electromechanical device having a mechanical structure disposed within the chamber. The device also includes a contact (i.e., a conductive region, such as the contact area and/or contact via) that is partially or wholly disposed outside of the chamber. The method includes depositing a sacrificial layer over at least a portion of the mechanical structure and depositing a first encapsulation layer (for example, a polycrystalline silicon, amorphous silicon, germanium, silicon/germanium or gallium arsenide) over the sacrificial layer. At least one vent is formed through the first encapsulation layer, and at least a portion of the sacrificial layer is removed to form the chamber. Thereafter, a second encapsulation layer is deposited over or in the vent to seal the chamber wherein the second encapsulation layer is a semiconductor material (for example, polycrystalline silicon, amorphous silicon, silicon carbide, silicon/germanium, germanium, or gallium arsenide).

The method of this aspect of the present invention includes forming a trench around the contact. An insulating material (for example, silicon dioxide or silicon nitride) may be disposed in the trench to electrically isolate the contact from adjacent conductive regions. In one embodiment, the trench surrounds the contact to electrically isolate the contact.

The method may further include depositing an insulating layer on at least a portion of the trench and, thereafter, depositing an highly conductive material on the contact and over the insulating layer to provide electrical connection to the contact. In one embodiment, a semiconductor material may be deposited in the trench after depositing the insulating material.

In another principal aspect, the present invention is a method of manufacturing an electromechanical device having a contact and a mechanical structure that resides in a chamber. The chamber may include a fluid having a pressure that provides mechanical damping for the mechanical structure. The method comprises depositing a first encapsulation layer (comprised of a semiconductor material, for example, polycrystalline silicon, amorphous silicon, silicon carbide, silicon/germanium, germanium, or gallium arsenide) over the mechanical structure. At least one vent is then formed in the first encapsulation layer and the chamber is formed. Thereafter, a second encapsulation layer (comprised of a semiconductor material, for example, polycrystalline silicon, porous polycrystalline silicon, amorphous silicon, silicon carbide, silicon/germanium, germanium, or gallium arsenide) is deposited over or in the vent to seal the chamber.

The method further includes forming a trench around at least a portion of the contact wherein the contact and the trench are disposed outside the chamber. Thereafter, a first material (for example, a silicon nitride or silicon dioxide) is deposited in the trench to electrically isolate the contact. The trench may surround and electrically isolate the contact.

In one embodiment, a second material may be deposited in the trench after deposition of the first material. The second material may be a semiconductor material.

In another embodiment, a first portion of the first encapsulation layer is comprised of a monocrystalline silicon and a second portion is comprised of a polycrystalline silicon. In this embodiment, a surface of the second encapsulation layer may be planarized to expose the first portion of the first encapsulation. Thereafter, a monocrystalline silicon may be grown on the first portion of the first encapsulation.

The method may further include depositing an insulating layer on at least a portion of the trench and, thereafter, depositing an highly conductive material on the contact and over the insulating layer to provide electrical connection to the contact. In one embodiment, a semiconductor material may be deposited in the trench after depositing the insulating material.

In another principal aspect, the present invention is an electromechanical device comprising a chamber including a first encapsulation layer (for example, polycrystalline silicon, porous polycrystalline silicon, amorphous silicon, germanium, silicon/germanium, gallium arsenide, silicon nitride or silicon carbide), having at least one vent, and a mechanical structure having at least a portion disposed in the chamber. The electromechanical device also includes a second encapsulation layer comprised of a semiconductor material (for example, polycrystalline silicon, porous polycrystalline silicon, amorphous silicon, silicon carbide, silicon/germanium, germanium, or gallium arsenide), deposited over or in the vent, to thereby seal the chamber.

The electromechanical device of this aspect of the invention includes a contact (at least partially disposed outside the chamber) and a trench. The trench is, disposed around at least a portion of the contact wherein the contact and the trench as disposed outside the chamber. The trench includes a first material (for example, an insulating material such as silicon dioxide and/or silicon nitride) disposed therein to electrically isolate the contact from surrounding conductive materials.

In one embodiment, the first material is an insulating material that is disposed on at least the outer surfaces of the trench and a second material is disposed in a central portion of the trench. The second material may be a semiconductor material.

In another embodiment, the trench is disposed on an etch stop region comprised of, for example, silicon nitride or silicon dioxide.

The device of this aspect of the present invention may include a first portion of the first encapsulation layer that is comprised of a monocrystalline silicon and a second portion is comprised of a polycrystalline silicon. In addition, the present invention may include a field region disposed outside and above the chamber wherein the field region is comprised of a monocrystalline silicon.

In one embodiment, the first portion of the first encapsulation layer may be comprised of a monocrystalline silicon and a second portion comprised of a porous or amorphous silicon. In this embodiment, the second encapsulation layer overlying the second portion of the first encapsulation layer is a polycrystalline silicon.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

There are many inventions described and illustrated herein. In one aspect, the present invention is directed to a MEMS device, and technique of fabricating or manufacturing a MEMS device, having mechanical structures encapsulated in a chamber prior to final packaging and/or completion of the device. The material that encapsulates the mechanical structures may include one or more of the following attributes: low tensile stress, good step coverage, maintains integrity when subjected to subsequent processing, does not significantly and/or adversely affect the performance characteristics of the mechanical structures (if coated with the material during its deposition, formation and/or growth) within the chamber, maintains designed, appropriate and/or suitable encapsulation attributes over operating conditions and/or time, and/or facilitates integration with high-performance integrated circuits. In one embodiment, the mechanical structures are encapsulated by a semiconductor material, for example, silicon (for example, monocrystalline silicon, polycrystalline silicon, amorphous silicon or porous polycrystalline silicon, whether doped or undoped), germanium, silicon-germanium, silicon carbide or gallium arsenide, or combinations thereof. Such materials may maintain one or more of the following attributes over typical operating conditions and the lifetime of the MEMS.

Figure 1:
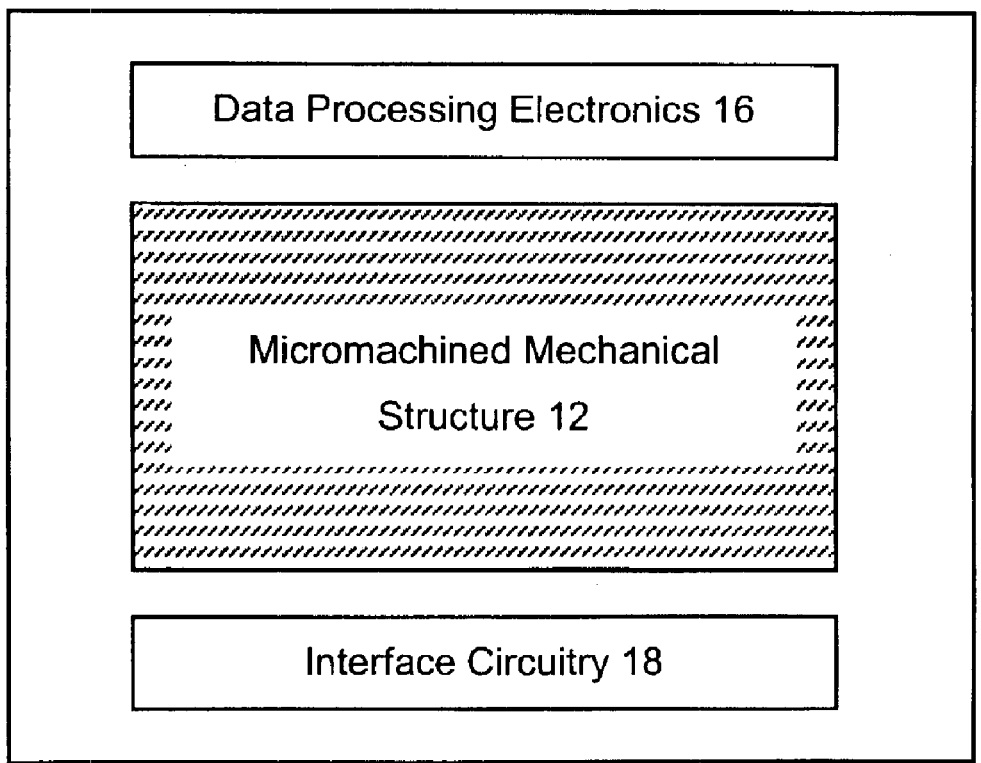
FIG. 1 is a block diagram of microelectromechanical system disposed on a substrate, in conjunction with interface circuitry and data processing electronics.

With reference to FIG. 1, in one exemplary embodiment, a MEMS 10 includes a micromachined mechanical structure 12 that is disposed on substrate 14, for example, an undoped semiconductor-like material, a glass-like material, or an insulator-like material. The MEMS 10 may also include data processing electronics 16, to process and analyze information generated by, and/or control or monitor the micromachined mechanical structure 12. In addition, MEMS 10 may also include interface circuitry 18 to provide the information from micromachined mechanical structure 12 and/or data processing electronics 16 to an external device (not illustrated), for example, a computer, indicator/display and/or sensor.

The data processing electronics 16 and/or interface circuitry 18 may be integrated in or on substrate 14. In this regard, MEMS 10 may be a monolithic structure including mechanical structure 12, data processing electronics 16 and interface circuitry 18. The data processing electronics 16 and/or interface circuitry 18 may also reside on a separate, discrete substrate that, after fabrication, is bonded to or on substrate 14.

Figure 2:
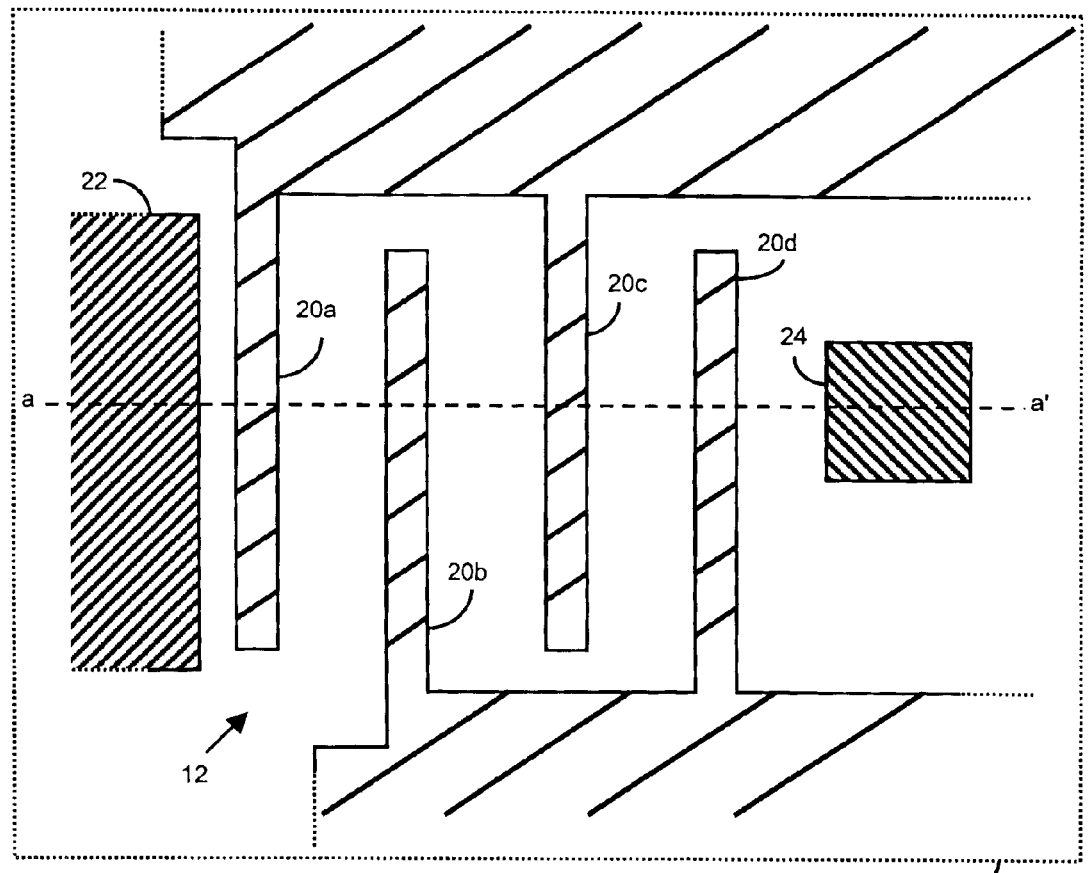
FIG. 2 illustrates a top view of a portion of micromechanical structure, for example, or portion of the interdigitated or comb-like finger electrode arrays of an accelerometer, in conjunction with a contact area and field region.

With reference to FIG. 2, in one embodiment, micromachined mechanical structure 12 includes mechanical structures 20a–d disposed on, above and/or in substrate 14. The mechanical structures 20a–20d may be comprised of, for example, materials in column IV of the periodic table, for example silicon, germanium, carbon; also combinations of these, for example silicon germanium, or silicon carbide; also of III–V compounds for example gallium phosphide, aluminum gallium phosphide, or other III–V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium suicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the micromachined mechanical structure 12 may be an accelerometer, gyroscope or other transducer (for example, pressure sensor, strain sensor, tactile sensor, magnetic sensor and/or temperature sensor), or resonator. The micromachined mechanical structure 12 may also include mechanical structures of a plurality of transducers or sensors including one or more accelerometers, gyroscopes, pressure sensors, tactile sensors and temperature sensors. Where micromachined mechanical structure 12 is an accelerometer, mechanical structures 20a–d may be a portion of the interdigitated or comb-like finger electrode arrays that comprise the sensing features of the accelerometer (See, for example, U.S. Pat. No. 6,122,964).

With continued reference to FIG. 2, field region 22 and contact area 24 are also disposed on or in substrate 14. The field region 22 may provide a substrate material for the electronic or electrical components or integrated circuits (for example, transistors, resistors, capacitors, inductors and other passive or active elements) of data processing electronics 16 and/or interface circuitry 18. The contact area 24 may provide an electrical path between micromachined mechanical structure 12 and data processing electronics 16, interface circuitry 18 and/or an external device (not illustrated). The field region 22 and contact area 24 may be comprised of, for example, silicon, (whether doped or undoped), germanium, silicon/germanium, silicon carbide, and gallium arsenide, and combinations thereof.

Figure 3:
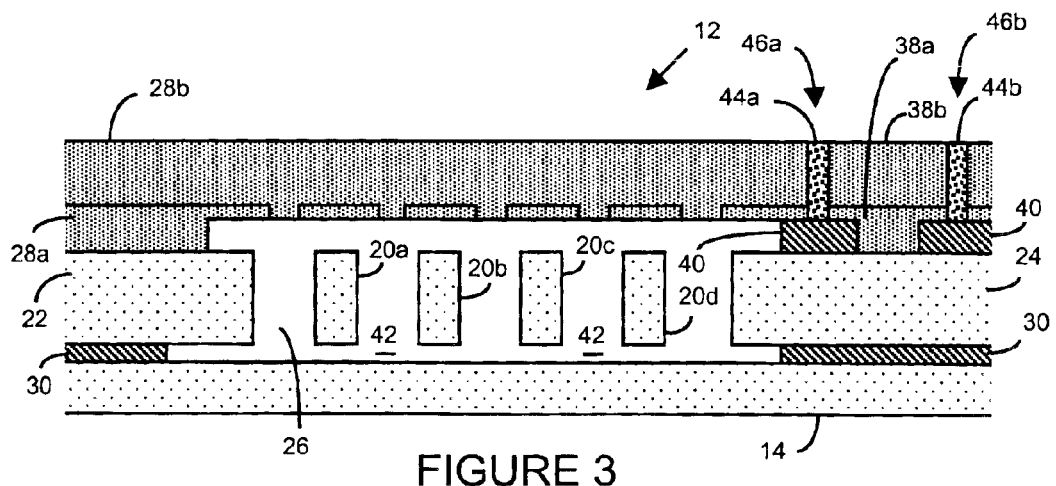
FIG. 3 illustrates a cross-sectional view (sectioned along dotted line a—a of FIG. 2) of the portion of the interdigitated or comb-like finger electrode array, contact area and field region of FIG. 2, in accordance with certain aspects of the present invention.

FIG. 3 illustrates a cross-sectional view of micromachined mechanical structure 12, including mechanical structures 20a–d, along dotted line a—a', in accordance with one embodiment of the present invention. The mechanical structures 20a–d are disposed within chamber 26. In one embodiment, chamber 26 is sealed or encapsulated via encapsulating layers 28a and 28b.

The encapsulating layers 28a and 28b may be comprised of, for example, a semiconductor. In one embodiment, encapsulating layers 28a and 28b may contain silicon (for example, monocrystalline silicon, polycrystalline silicon, amorphous silicon or porous polycrystalline silicon, whether doped or undoped), germanium, silicon/germanium, silicon carbide, and gallium arsenide (and combinations thereof).

The encapsulating layers 28a and 28b may be the same materials or different materials.

The encapsulating layers 28a and 28b may be deposited, formed and/or grown using the same or different techniques. For example, encapsulating layer 28a may be a polycrystalline silicon deposited using a low pressure ("LP") chemically vapor deposited ("CVD") process (in a tube or EPI reactor) or plasma enhanced ("PE") CVD process and encapsulating layer 28b may be a doped polycrystalline silicon deposited using an atmospheric pressure ("AP") CVD process. Alternatively, for example, encapsulating layer 28a may be a silicon germanium deposited using a LPCVD process and encapsulating layer 28b may be doped polycrystalline silicon deposited using a PECVD process. Indeed, all semiconductor materials and deposition techniques, and permutations thereof, for encapsulating chamber 26, whether now known or later developed, are intended to be within the scope of the present invention.

It should be noted that the mechanical structures of one or more transducers or sensors (for example, accelerometers, gyroscopes, pressure sensors, tactile sensors and/or temperature sensors) may be contained or reside in a single chamber and exposed to an environment within that chamber. Under this circumstance, the environment contained in chamber 26 provides a mechanical damping for the mechanical structures of one or more micromachined mechanical structures (for example, an accelerometer, a pressure sensor, a tactile sensor and/or temperature sensor).

Moreover, the mechanical structures of the one or more transducers or sensors may themselves include multiple layers that are vertically and/or laterally stacked or interconnected. (See, for example, micromachined mechanical structure 12b of FIG. 13A; micromachined mechanical structure 12 of FIGS. 13B and 13C; and mechanical structures 20a and 20b, contact areas 24a and 24b, and buried contacts 24' and 24" of FIG. 13D). Thus, under this circumstance, the mechanical structures are fabricated using one or more processing steps to provide the vertically and/or laterally stacked and/or interconnected multiple layers.

In one aspect of the present invention, contact area 24 of micromachined mechanical structure 12 is electrically isolated from nearby electrically conducting regions (for example, second encapsulation layer 28b and/or a field region (not illustrated)). With continued reference to FIG. 3, micromachined mechanical structure 12 includes dielectric isolation regions 44a and 44b that include an insulating material disposed in trenches 46a and 46b. The dielectric isolation regions 44a and 44b (and trenches 46a and 46b) may surround contact 24 to electrically isolate contact 24 from any nearby electrically conducting regions.

Figure 4A:
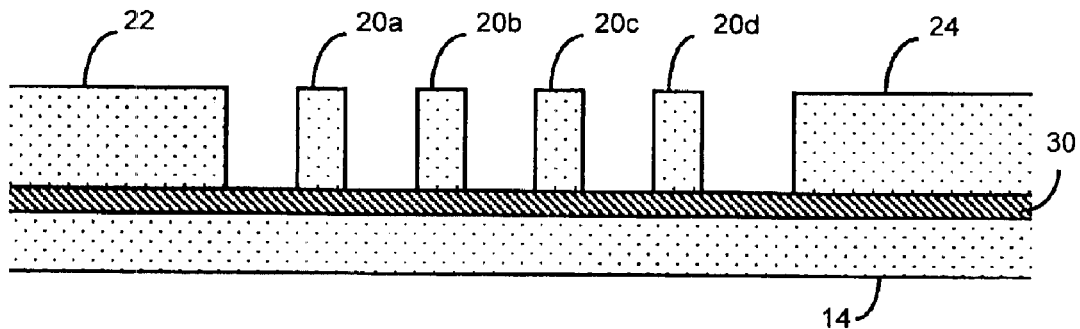
FIGS. 4A–4I illustrate cross-sectional views of the fabrication of the microstructure of FIG. 3 at various stages of the process, according to certain aspects of the present invention.
Figure 4B:
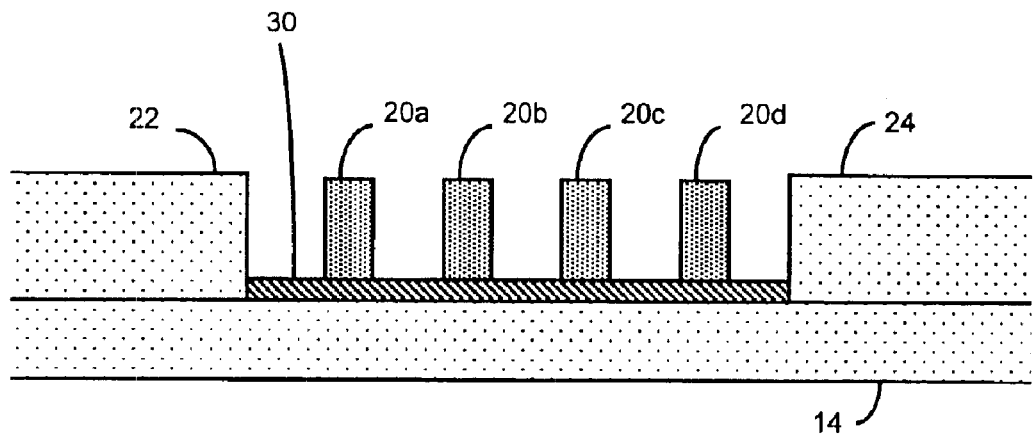

With reference to FIGS. 4A and 4B, an exemplary method of fabricating or manufacturing a micromachined mechanical structure 12 may begin with a partially formed device including mechanical structures 20a–d and contact area 24 disposed on first sacrificial layer 30, for example, silicon dioxide or silicon nitride. Mechanical structures 20a–d and contact area 24 may be formed using well-known deposition, lithographic, etching and/or doping techniques as well as from well-known materials (for example, semiconductors such as silicon, germanium, silicon-germanium or gallium-arsenide). Moreover, field region 22 and first sacrificial layer 30 may be formed using well-known silicon-on-insulator fabrication techniques (FIG. 4A) or well-known formation, lithographic, etching and/or deposition techniques using a standard or over-sized ("thick") wafer (FIG. 4B). Notably, field region 22, mechanical structures 20 and contact area 24 may be comprised of single or monocrystalline structures (for example, monocrystalline silicon) as illustrated in FIG. 4A, polycrystalline structures, or both monocrystalline and polycrystalline structures as illustrated in FIG. 4B (i.e., field region 22 is comprised of a single or monocrystalline structure, for example, monocrystalline silicon, and mechanical structures 20 and contact area 24 may be comprised of polycrystalline structures, for example, polycrystalline silicon. Indeed, all techniques, materials and crystal structures for creating a partially formed device including mechanical structures 20a–d and contact area 24 disposed on first sacrificial layer 30, whether now known or later developed, are intended to be within the scope of the present invention.

Figure 4C:
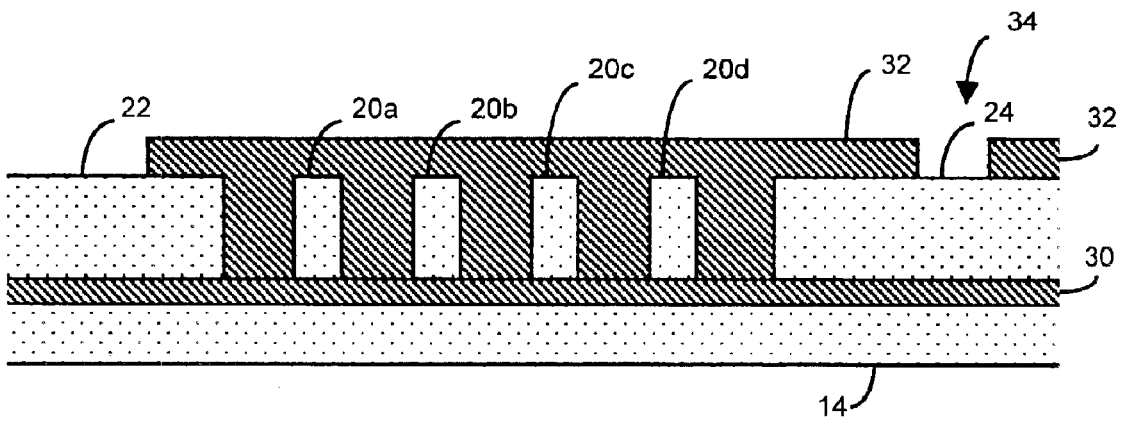

With reference to FIG. 4C, following formation of mechanical structures 20a–d and contact area 24, a second sacrificial layer 32, for example, silicon dioxide or silicon nitride, may be deposited and/or formed to secure, space and/or protect mechanical structures 20a–d during subsequent processing, including the encapsulation process. In addition, an opening 34 may be etched or formed into second sacrificial layer 32 to provide for subsequent formation of an electrical contact. The opening 34 may be provided using, for example, well known masking techniques (such as a nitride mask) prior to and during deposition and/or formation of second sacrificial layer 32, and/or well known lithographic and etching techniques after deposition and/or formation of second sacrificial layer 32.

Figure 4D:
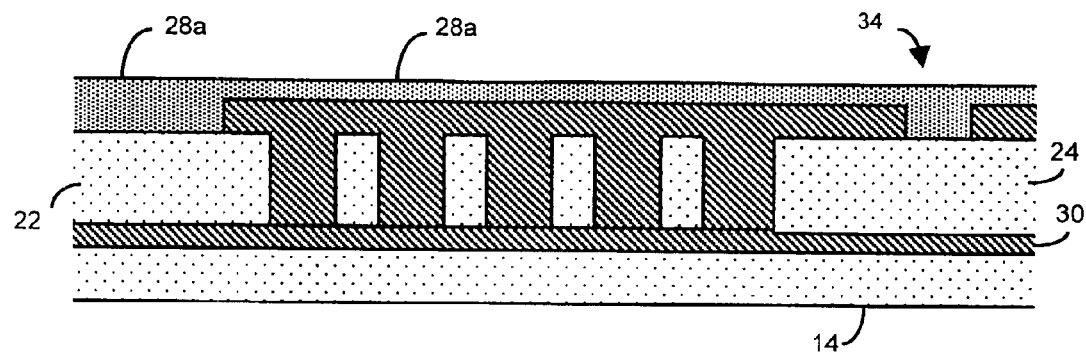
Figure 4E:
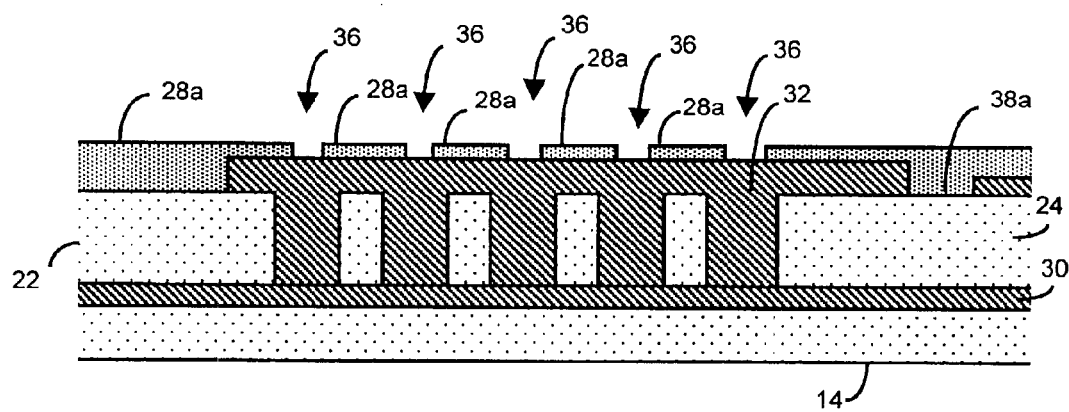
Figure 4F:
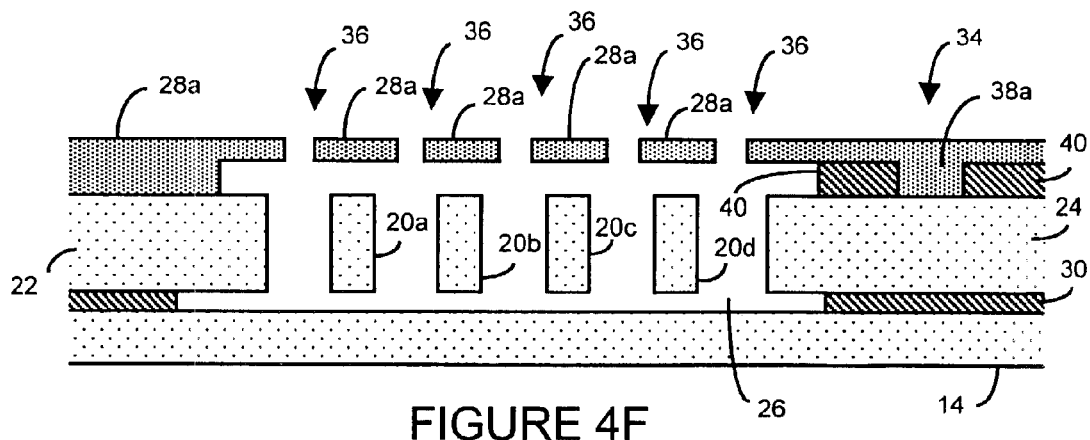

With reference to FIGS. 4D, 4E and 4F, thereafter, first encapsulation layer 28a may be deposited, formed and/or grown on second sacrificial layer 32 (see, FIG. 4D). In one embodiment, the thickness of first encapsulation layer 28a in the region overlying second sacrificial layer 32 may be between 0.1 $\mu$m and 5.0 $\mu$m. The external environmental stress on, and internal stress of first encapsulation layer 28a after etching second sacrificial layer 32 may impact the thickness of first encapsulation layer 28a. Slightly tensile films may self-support better than compressive films which may buckle.

The first encapsulation layer 28a may be etched to form passages or vents 36 (see, FIG. 4E). In one exemplary embodiment, the vents have a diameter or aperture size of between 0.1 $\mu$m to 2 $\mu$m.

The vents 36 are intended to permit etching and/or removal of at least selected portions of first and second sacrificial layers 30 and 32, respectively (see, FIG. 4F). For example, in one embodiment, where first and second sacrificial layers 30 and 32 are comprised of silicon dioxide, selected portions of layers 30 and 32 may be removed/etched using well known wet etching techniques and buffered HF mixtures (i.e., a buffered oxide etch) or well known vapor etching techniques using vapor HF. Proper design of mechanical structures 20a–d and sacrificial layers 30 and 32, and control of the HF etching process parameters may permit the sacrificial layer 30 to be sufficiently etched to remove all or substantially all of layer 30 around mechanical elements 20a–d and thereby release elements 20a–d to permit proper operation of MEMS 10.

In another embodiment, where first and second sacrificial layers 30 and 32 are comprised of silicon nitride, selected portions of layers 30 and 32 may be removed/etched using phosphoric acid. Again, proper design of mechanical structures 20a–d and sacrificial layers 30 and 32, and control of the wet etching process parameters may permit the sacrificial layer 30 to be sufficiently etched to remove all or substantially all of sacrificial layer 30 around mechanical elements 20a–d which will release mechanical elements 20a–d.

It should be noted that there are: (1) many suitable materials for layers 30 and/or 32 (for example, silicon dioxide, silicon nitride, and doped and undoped glass-like materials, e.g., phosphosilicate ("PSG") or borophosphosilicate ("BPSG")) and spin on glass ("SOG")), (2) many suitable/associated etchants (for example, a buffered oxide etch, phosphoric acid, and alkali hydroxides such as, for example, NaOH and KOH), and (3) many suitable etching or removal techniques (for example, wet, plasma, vapor or dry etching), to eliminate, remove and/or etch sacrificial layers 30 and/or 32. Indeed, layers 30 and/or 32 may be a doped or undoped semiconductor (for example, polycrystalline silicon, silicon/germanium or germanium) in those instances where mechanical structures 20a–d and contact area 24 are the same or similar semiconductors (i.e., processed, etched or removed similarly) provided that mechanical structures 20a–d and contact area 24 are not adversely affected by the etching or removal processes (for example, where structures 20a–d and area 24 are "protected" during the etch or removal process (e.g., an oxide layer protecting a silicon based structures 20a–d) or where structures 20a–d and contact area 24 are comprised of a material that is adversely affected by the etching or removal process of layers 30 and/or 32). Accordingly, all materials, etchants and etch techniques, and permutations thereof, for eliminating, removing and/or etching, whether now known or later developed, are intended to be within the scope of the present invention.

It should be further noted that, in certain embodiments, in addition to forming vents 36, the etching process of first encapsulation layer 28a removes the material overlying contact area 24 to form contact via 38a to facilitate electrical continuity from electrical contact area 24 to a level to or above first encapsulation layer 28a. In this way, additional processing may be avoided, eliminated and/or minimized, for example, processing related to removal of the portion of first encapsulation layer 28a overlying electrical contact area 24 and deposition, formation and/or growth of a suitable material (to provide adequate electrical contact between the various layers of MEMS 10, for example, monocrystalline silicon). Indeed, the resistivity or conductivity of contact via 38 may be adjusted (for example, resistivity reduced and/or conductivity enhanced) using well-known impurity implantation techniques.

Moreover, contact 24 may remain partially, substantially or entirely surrounded by portions of first and second sacrificial layers 30 and/or 32. For example, with reference to FIG. 4F, while mechanical structures 20a–d are released from their respective underlying oxide columns, a portion 40 of sacrificial layer 32 (i.e., juxtaposed electrical contact area 24 may remain after etching or removing second sacrificial layer 32. This portion of second sacrificial layer 32 may function as an etch stop during later processing. Under this circumstance, it may be advantageous to employ materials for layers 30 and/or 32 that are consistent with the process to form trenches 46a and 46b such that the remaining portions of the second sacrificial layer 32 may function as an etch stop during formation of trenches 44a and 44b. This notwithstanding, layers 30 and/or 32 may be, for example, silicon dioxide, silicon nitride, and doped and undoped glass-like materials, and SOG.

It should be noted that, in another embodiment, an insignificant amount of material comprising second sacrificial layer 32 (or little to no second sacrificial layer 32) remains after etching second sacrificial layer 32. As such, materials for layers 30 and/or 32 may be selected with little regard to subsequent processing.

Figure 4G:
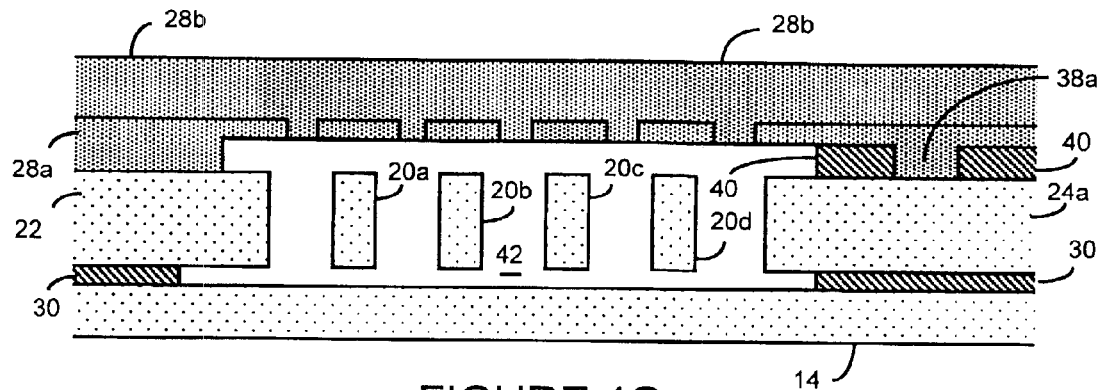

With reference to FIG. 4G, after releasing mechanical elements 20a–d, a second encapsulation layer 28b may be deposited, formed and/or grown. The second encapsulation layer 28b may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 28a. However, it may be advantageous to employ the same material to form first and second encapsulation layers 28a and 28b. In this way, for example, the thermal expansion rates are the same and the boundaries between layers 28a and 28b may enhance the "seal" of chamber 26 and enhance the integrity of fluid 42 (for example, maintaining a desired or designed pressure of fluid 42 within chamber 26 over various operating conditions and extended periods of time).

In one embodiment, second encapsulation layer 28b may be epitaxially deposited using an epitaxy reactor and conditions similar to conventional selective epitaxial silicon growth. This may be in a silane, dichlorosilane, or trichlorosilane process with $H_2$, and/or HCl gases. These processes may typically be run from 600° C. to 1400° C.

In one embodiment, the thickness of second encapsulation layer 28b in the region overlying second first encapsulation layer and elements 20a–d may be between 5 µm and 25 µm. Indeed, as MEMS 10, including mechanical structure 12, scale over time and various and/or different materials are implemented, the suitable or necessary thicknesses of first encapsulation layer 28a, second encapsulation layer 28b and combination thereof are likely to change. As such, a ratio of about 1:1 to 1:10 between thicknesses of first encapsulation layer 28a and second encapsulation layer 28b may be advantageous. It is noted, however, that other ratios and thicknesses are clearly suitable (see, for example, FIGS. 9A–9D, 1A–10D and 11A–D).

Figure 4H:
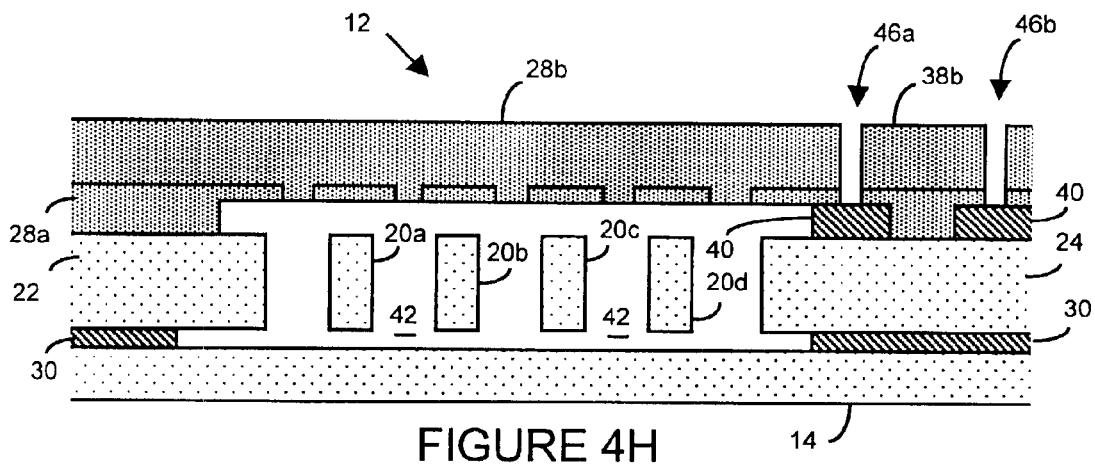
Figure 4I:
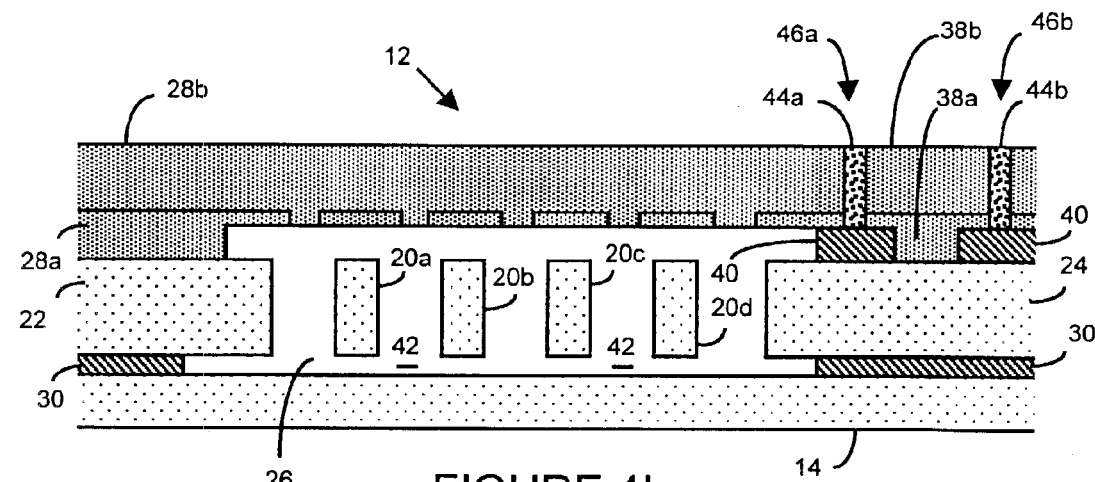
Figure 5:
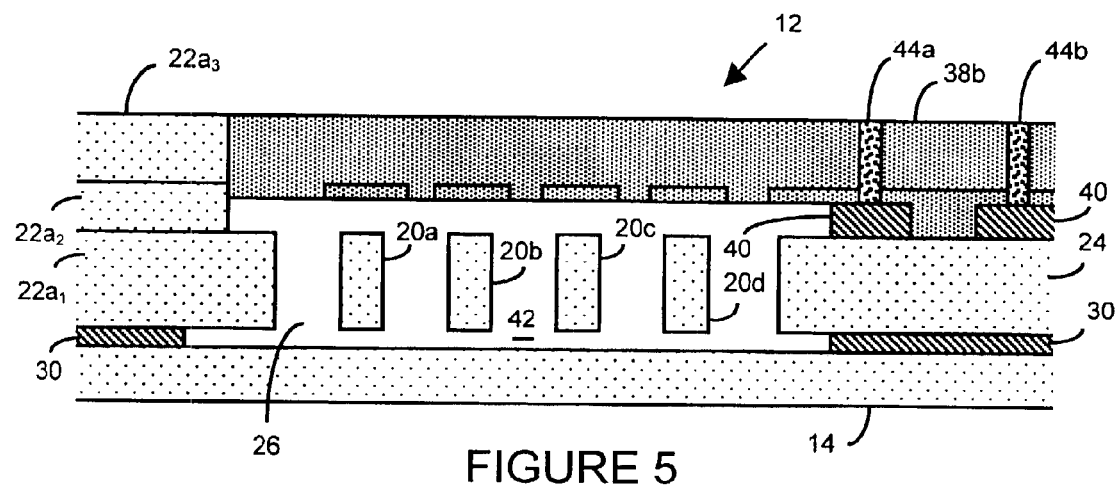
FIG. 5 illustrates a cross-sectional view of additional fabrication processes of the microstructure of FIG. 3, according to certain aspects of the present invention.

As mentioned above, in one aspect of the present invention, contact area 24 of micromachined mechanical structure 12 is dielectrically isolated from the surrounding conductor and/or semiconductor layers. With reference to FIG. 4H, trenches 46a and 46b may be etched. The trenches 46a and 46b may include a slight taper in order to facilitate the formation of isolation regions 44a and 44b. In this regard, an insulating material may be deposited in trenches 46a and 46b to form dielectric isolation regions 44a and 44b, respectively. The insulating material may be, for example, silicon dioxide, silicon nitride, BPSG, PSG, or SOG. It may be advantageous to employ silicon nitride because silicon nitride may be deposited in a conformal manner. Moreover, silicon nitride is compatible with CMOS processing, in the event that MEMS 10 includes CMOS integrated circuits.

It may also be advantageous to employ multiple layers of insulation materials, for example, silicon dioxide and silicon nitride or silicon dioxide and silicon. In this way, suitable dielectric isolation is provided in view of manufacturability considerations.

After formation of dielectric isolation regions 44a and 44b, it may be advantageous to substantially planarize micromachined mechanical structure 12 to provide a "smooth" surface layer and/or (substantially) planar surface using, for example, polishing techniques (for example, chemical mechanical polishing ("CMP")). In this way, the exposed planar surface of micromachined mechanical structure 12 may be a well-prepared base upon which integrated circuits (for example, CMOS transistors) and/or micromachined mechanical structure 12 may be fabricated on or in using well known fabrication techniques and equipment.

To facilitate integration of high performance integrated circuits in MEMS 10, it may be advantageous to include field region 22 that is comprised of monocrystalline silicon in or on which such circuits may be fabricated. In this regard, with reference to FIG. 5, in one embodiment, a portion of first encapsulation layer (i.e., $22a_2$) and/or second encapsulation layer (i.e., $22a_3$) that overlies field region $22a_1$ may be recrystalized thereby "converting" or re-arranging the crystal structure of the polycrystalline material to that of a monocrystalline or substantially monocrystalline material. In this way, transistors or other components of, for example, data processing electronics 16, that are integrated in MEMS 10 may be fabricated in monocrystalline field regions.

In another embodiment, the portion of first encapsulation layer 28a overlying field region $22a_1$, may be removed, using conventional etching techniques, to expose field region $22a_1$. Thereafter, monocrystalline silicon may be grown on field region $22a_1$ to thereby provide field regions $22a_2$ and/or $22a_3$.

In yet another embodiment, the portion of first encapsulation layer 28a overlying field region $22a_1$ may be etched to expose field region $22a_1$, which is comprised of monocrystalline structure. Thereafter, transistors or other active components may be integrated in or on field region $22a_1$ using well-known fabrication techniques.

With reference to FIGS. 6A–6H, in another set of embodiments, monocrystalline structure may be deposited, grown or formed on field region $22a_1$ and contact area 24 before, concurrently (simultaneously) or after deposition, formation and/or growth of first encapsulation layer 28a. For example, with reference to FIG. 6C, before or after deposition or formation of second sacrificial layer 32, an epitaxially deposited encapsulation layer of monocrystalline silicon field region $22a_2$ and contact via 38a may be grown to a level that is above or exceeds second sacrificial layer 32. Alternatively, monocrystalline silicon field regions $22a_2$ and $22b_2$ are not grown to a level that is above or exceeds second sacrificial layer 32 (not illustrated).

After growing monocrystalline silicon field region $22a_2$ and contact via 38a, first encapsulation layer 28a may be deposited, formed and/or grown. The first encapsulation layer 28a may be, for example, a silicon-based material (for example, silicon/germanium, silicon carbide, monocrystalline silicon, polycrystalline silicon or amorphous silicon, whether doped or undoped), germanium, and gallium arsenide (and combinations thereof, which is deposited and/or formed using, for example, an epitaxial, a sputtering or a CVD-based reactor (for example, APCVD, LPCVD, or PECVD). The deposition, formation and/or growth may be by a conformal process or non-conformal process. The material may be the same as or different from first monocrystalline silicon field region $22a_2$. In the illustrated embodiment, first encapsulation layer 28a is comprised of a polycrystalline silicon material.

Figure 6A:
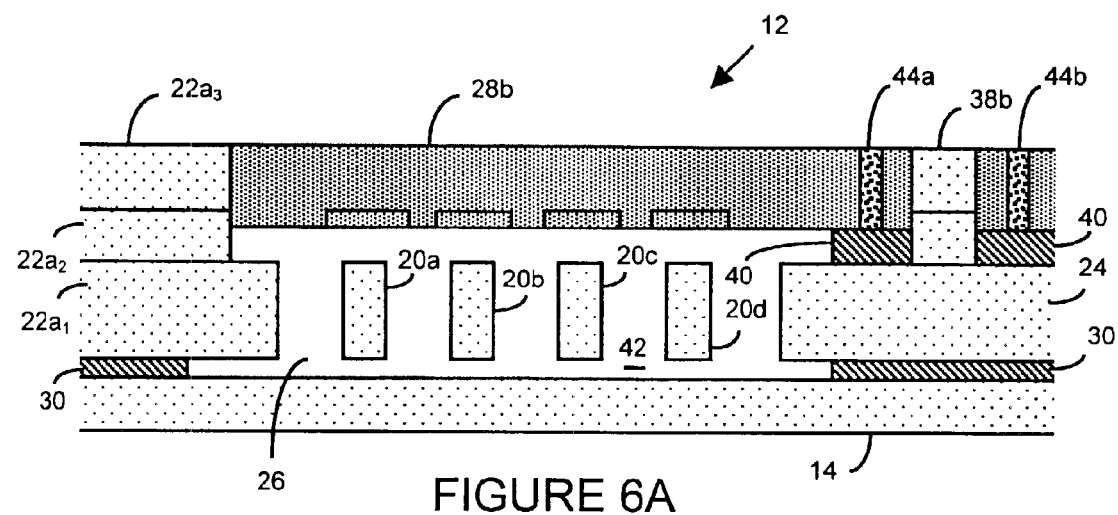
FIGS. 6A–6H illustrate cross-sectional views of the fabrication of the microstructure of FIG. 3 at various stages of the process, according to certain aspects of the present invention.
Figure 6B:
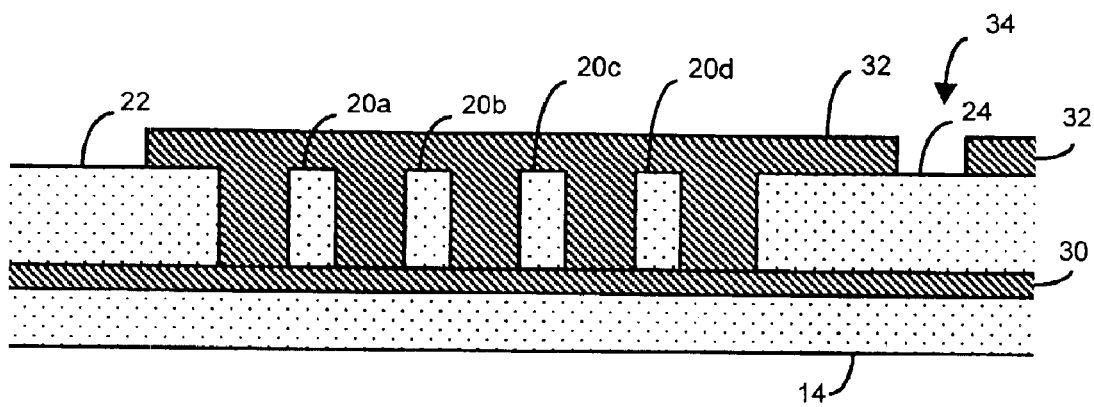
Figure 6C:
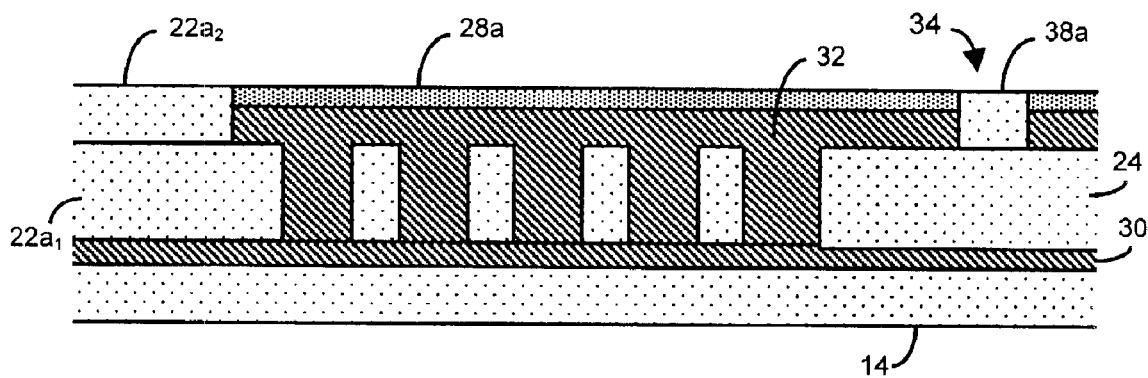
Figure 6D:
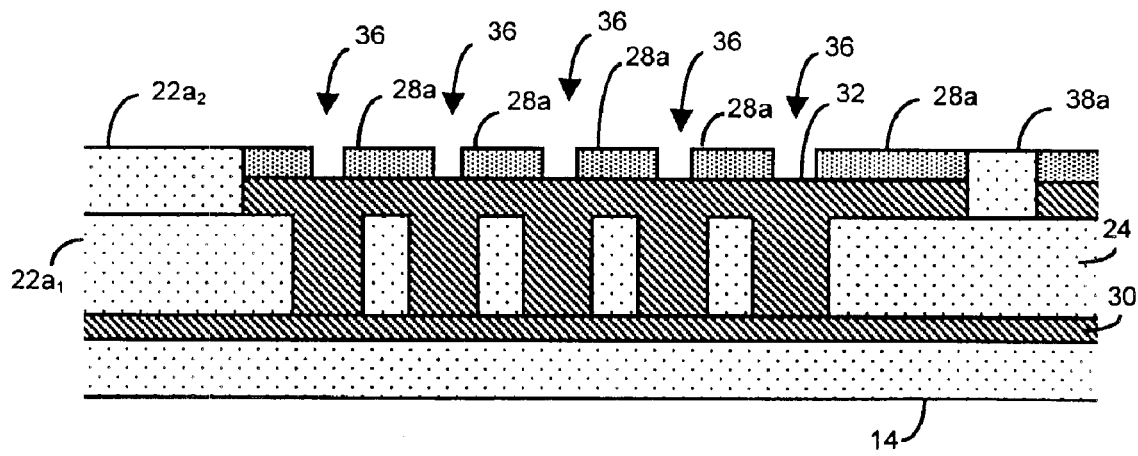
Figure 6E:
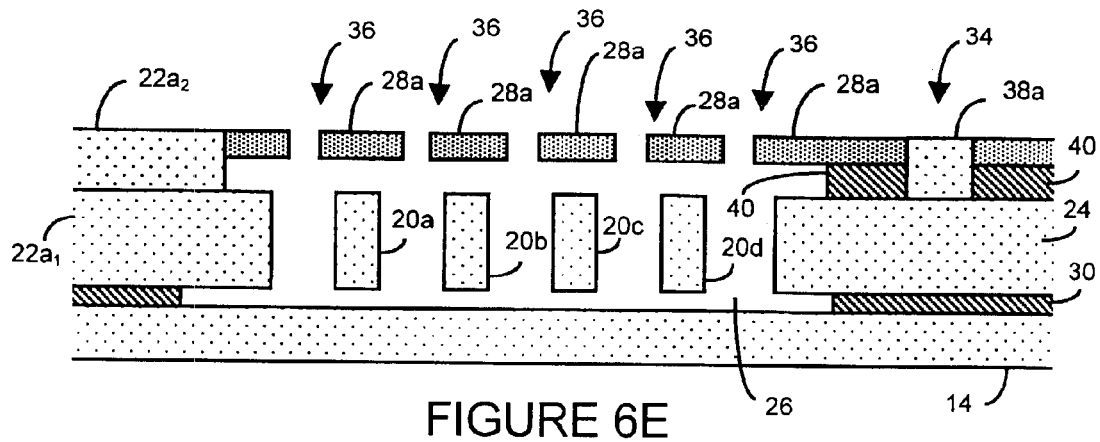

The subsequent processing of micromachined mechanical structure 12 of FIGS. 6D and 6E is substantially similar to that described above with respect to FIGS. 4E and 4F. As such, the discussion above with respect to micromachined mechanical structure 12, in conjunction with FIGS. 4E and 4F, is entirely, fully and completely applicable to this set of embodiments. For the sake of brevity, that description will not be repeated but rather will be summarized.

Briefly, first encapsulation layer 28a may be etched (see, FIG. 6D) to form passages or vents 36 that are intended to permit etching and/or removal of at least selected portions of first and second sacrificial layers 30 and 32, respectively (see, FIG. 6E). Again, proper design of mechanical structures 20a–d and sacrificial layers 30 and 32, and control of the etch process parameters may permit the sacrificial layer 30 to be sufficiently etched to remove all or substantially all of layer 30 around mechanical elements 20a–d and thereby release mechanical elements 20a–d to permit proper operation of MEMS 10 (see, FIG. 6E).

Figure 6F:
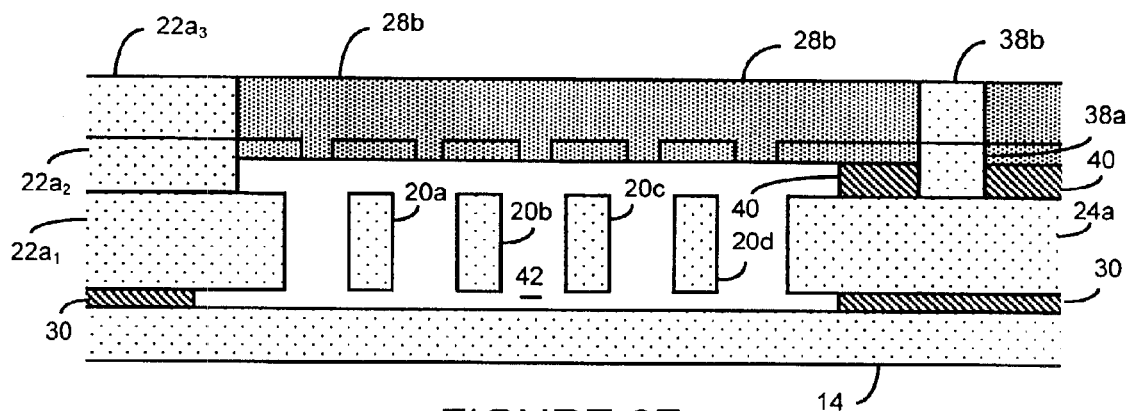

After releasing mechanical elements 20a–d, second encapsulation layer 28b may be deposited, formed and/or grown (see, FIG. 6F). Before, concurrently (simultaneously) or after deposition, formation and/or growth of second encapsulation layer 28b, a monocrystalline structure may be deposited, grown or formed on field region $22a_2$ and contact via 38a.

The second encapsulation layer 28b may be, for example, a silicon-based material (for example, a monocrystalline silicon, polycrystalline silicon and/or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 28a. As mentioned above, however, it may be advantageous to employ the same material to form first and second encapsulation layers 28a and 28b in order to enhance the "seal" of chamber 26.

It should be noted that the materials and/or surfaces underlying first and second encapsulation layer 28a and 28b, as well as the techniques employed to deposit, form and/or grow first and second encapsulation layer 28a and 28b, may initially determine the crystalline structure of the underlying material. For example, in an epitaxial environment having a predetermined set of parameters, the single/mono crystalline structure of encapsulation layers 28a and/or 28b will deposit, form and/or grow in a "retreating" manner (see, FIG. 7A). In contrast, with another predetermined set of parameters, the single/mono crystalline structure of encapsulation layers 28a and/or 28b will deposit, form and/or grow in an "advancing" manner (see, FIG. 7B). The structures and elements herein may be deposited, formed and/or grown in these or other manners. Accordingly, the single/mono crystalline structure (for example, field region $22a_2$) that is deposited, formed and/or grown on a material having single/mono crystalline structure (for example, field region $22a_1$) is illustrated as depositing, forming and/or growing in the perpendicular direction (see, for example, FIG. 7C) regardless of the manner or processes of employed.

It should be further noted that the material comprising second encapsulation layer 28b may deposit, form or grow over surfaces in chamber 26 (for example, the surfaces of mechanical structures 20a–d) as the chamber is sealed or encapsulated. When depositing, forming and/or growing second encapsulation layer 28b, care may need to be taken to preserve the desired integrity of the structures and/or surfaces within chamber 26 (see, for example, FIG. 15).

Figure 6G:
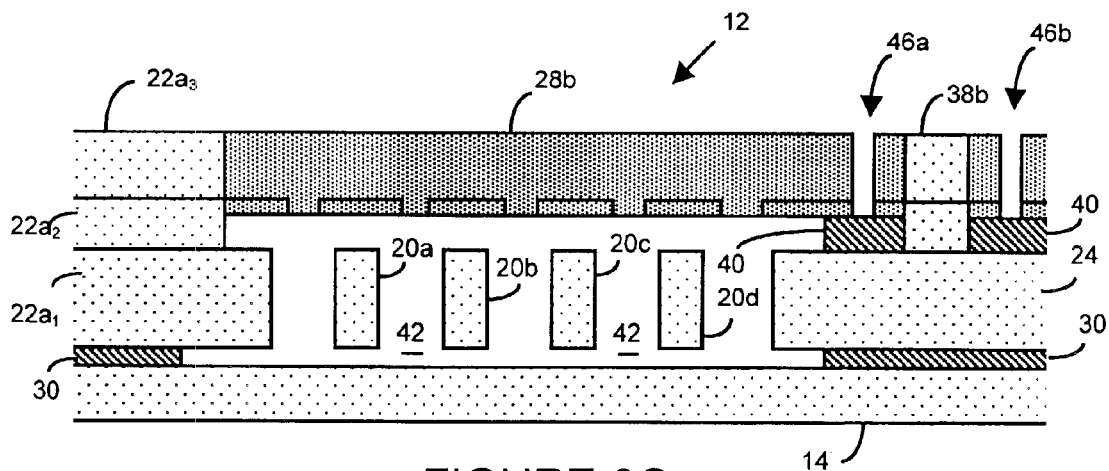
Figure 6H:
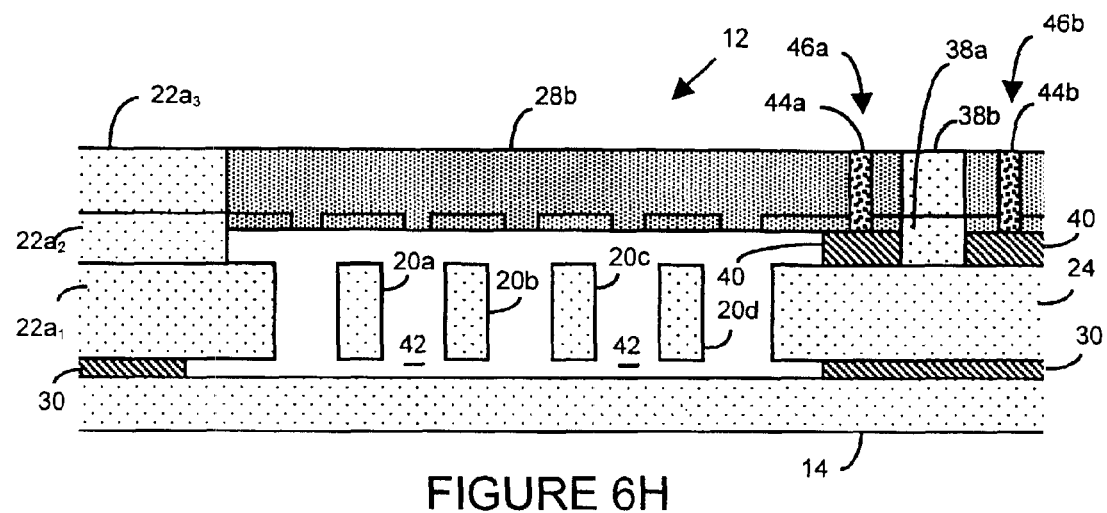
Figure 7A:
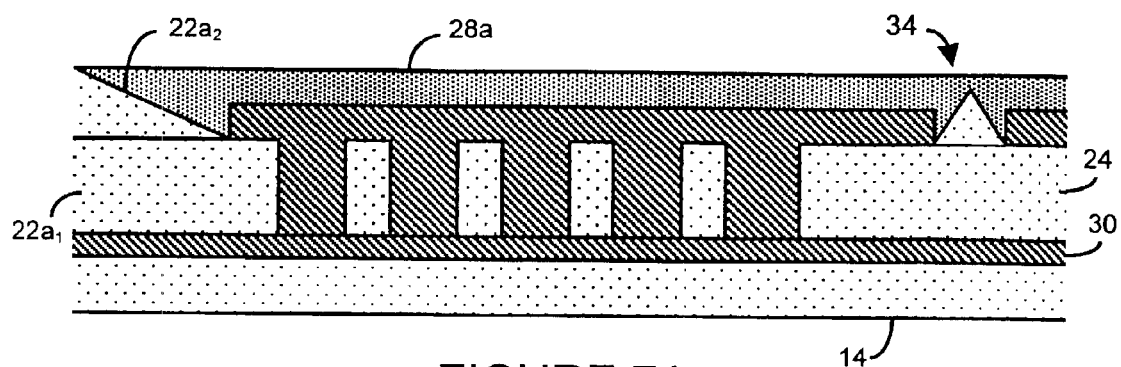
FIGS. 7A–7C illustrate, among other things, cross-sectional views of more representative illustrations of the growth of single crystal structures using non-conformal and conformal deposition, growth and/or formation techniques.
Figure 7B:
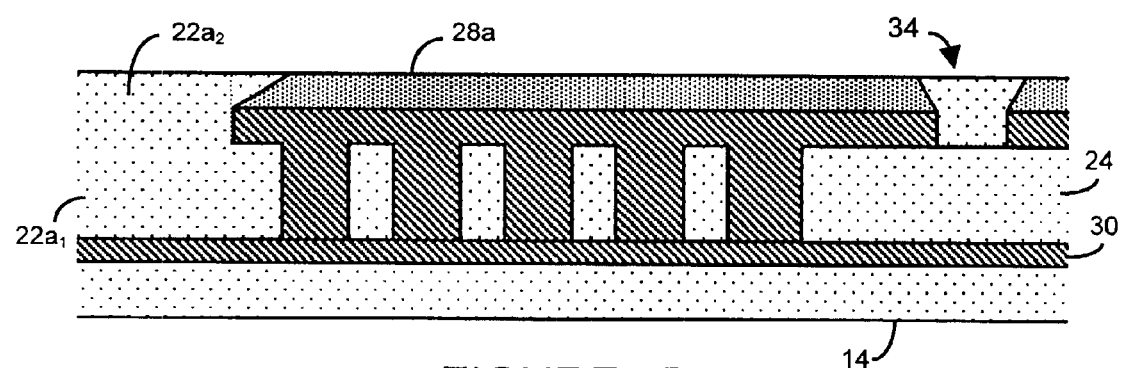
Figure 7C:
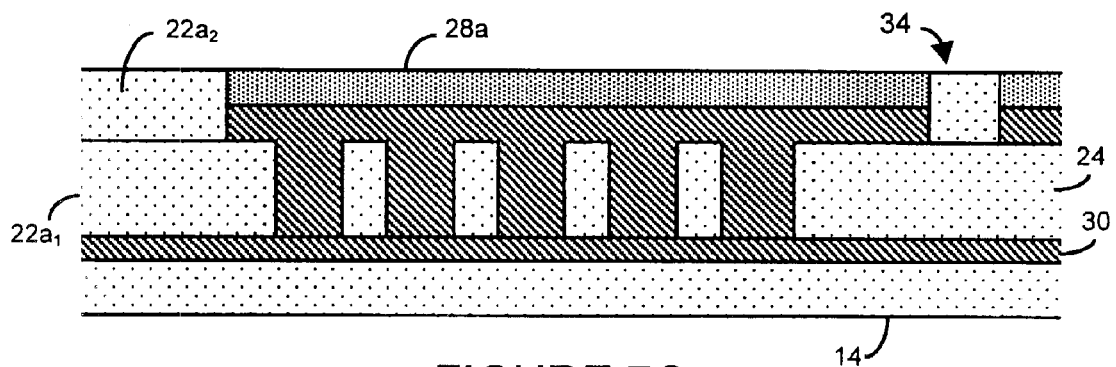

Again, the subsequent processing of micromachined mechanical structure 12 of FIGS. 6G and 6H is substantially similar to that described above with respect to FIGS. 4H and 4I. The discussion above with respect to micromachined mechanical structure 12, in conjunction with FIGS. 4E and 4F, is entirely, fully and completely applicable to this set of embodiments. For the sake of brevity, that description will only be summarized.

The trenches 46a and 46b may be etched (see, FIG. 6G) and an insulating material may be deposited in trenches 46a and 46b to form dielectric isolation regions 44a and 44b, respectively (see, FIG. 6H). The insulating material may be, for example, silicon dioxide, silicon nitride, BPSG, PSG, or SOG. It may be advantageous to employ silicon nitride because silicon nitride may be deposited in a conformal manner. It may also be advantageous to employ multiple layers of insulation materials, for example, silicon dioxide and silicon nitride or silicon dioxide and silicon. In this way, suitable dielectric isolation is provided in view of manufacturability considerations. Moreover, silicon nitride is compatible with CMOS processing, in the event that MEMS 10 includes CMOS integrated circuits.

After formation of dielectric isolation regions 44a and 44b, it may be advantageous to substantially planarize micromachined mechanical structure 12 to provide a "smooth" surface layer and/or (substantially) planar surface. In this way, the exposed planar surface of micromachined mechanical structure 12 may be well-prepared base upon which integrated circuits (for example, CMOS transistors) and/or micromachined mechanical structure 12 may be fabricated on or in using well known fabrication techniques and equipment.

Figure 8A:
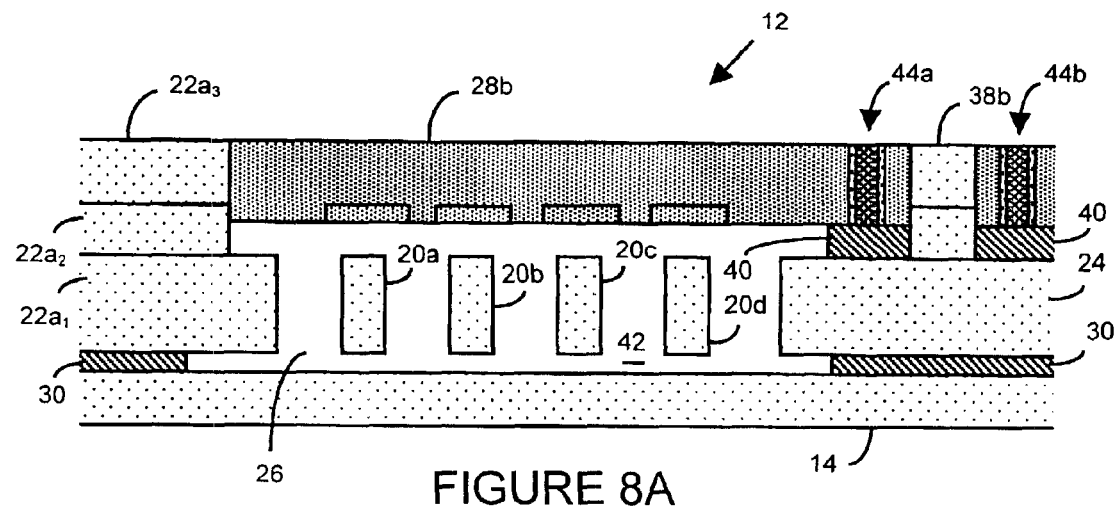
FIGS. 8A–8E illustrate cross-sectional views of the microstructure, including the isolation trench, according to certain aspects of the present invention.
Figure 8B:
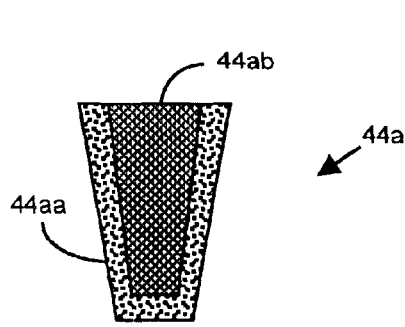
Figure 8C:
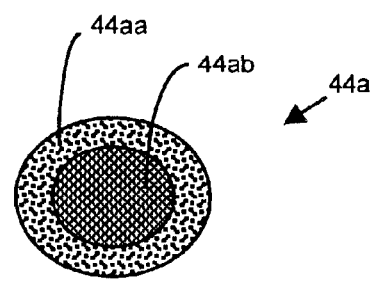
Figure 8D:
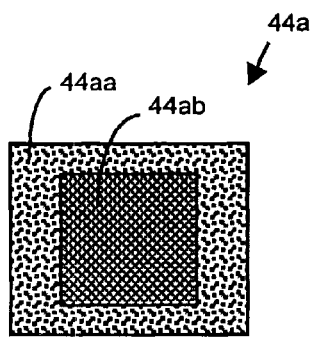
Figure 8E:
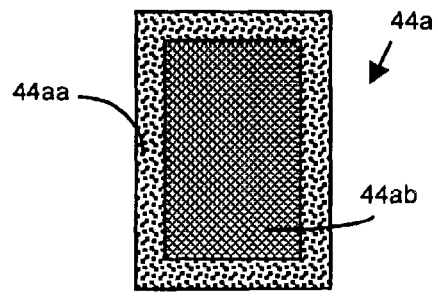
Figure 9A:
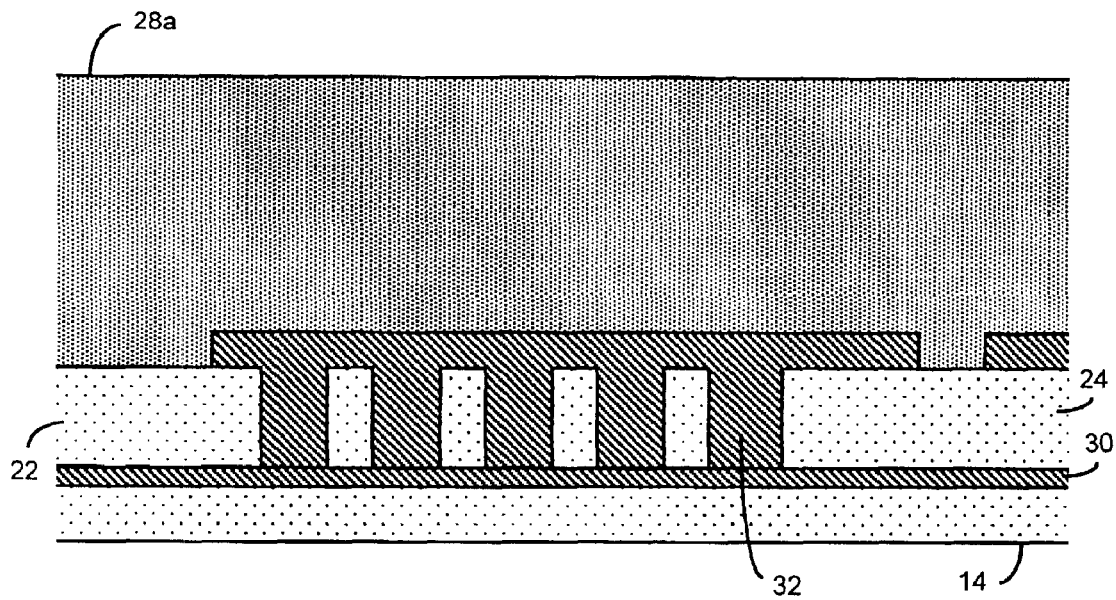
FIGS. 9A–9D and 10A–C illustrate portions of the fabrication of the interdigitated or comb-like finger electrode array microstructure of FIG. 2, sectioned along dotted line a—a, in accordance with other aspects of the present invention.
Figure 9B:
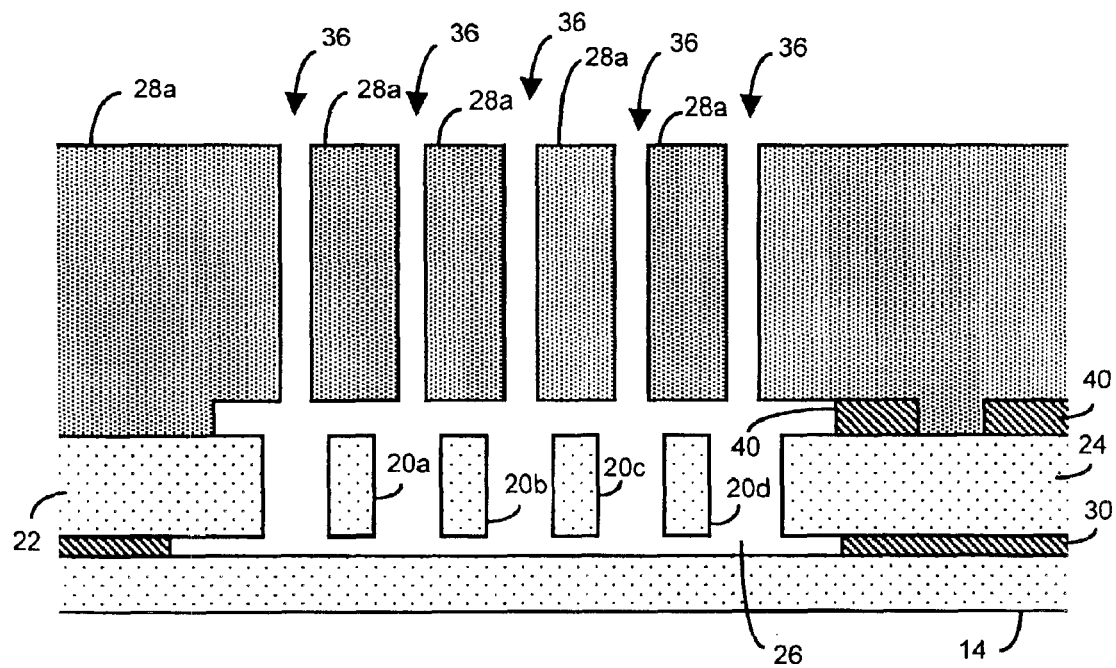
Figure 9C:
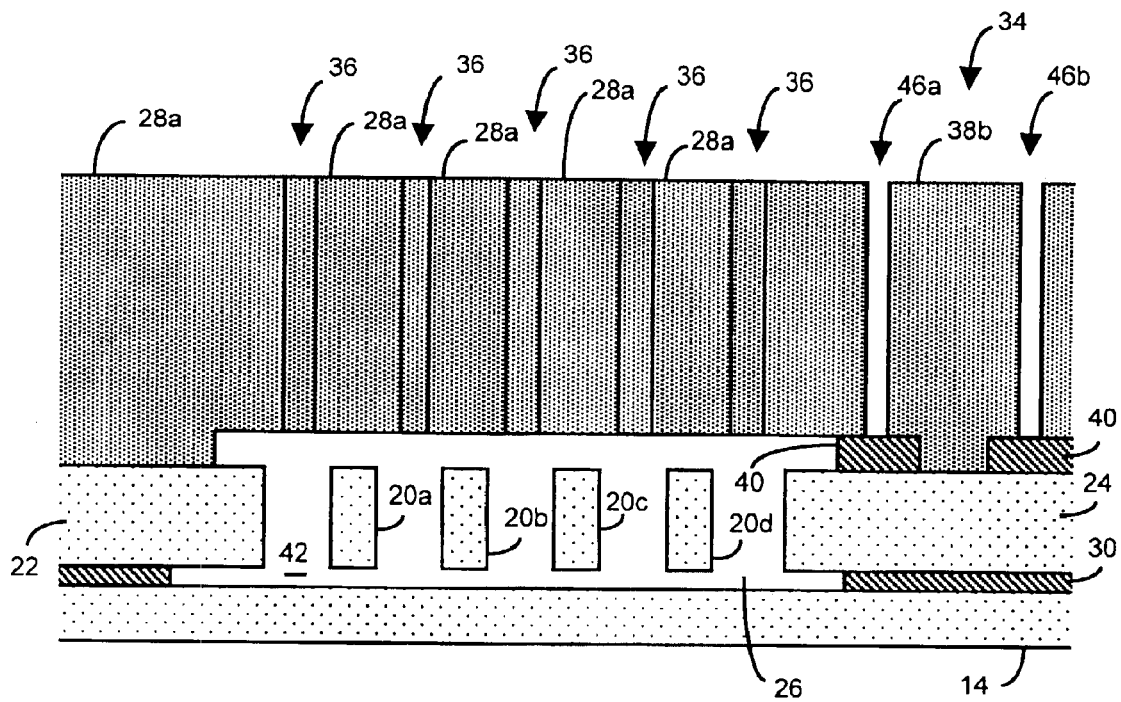
Figure 9D:
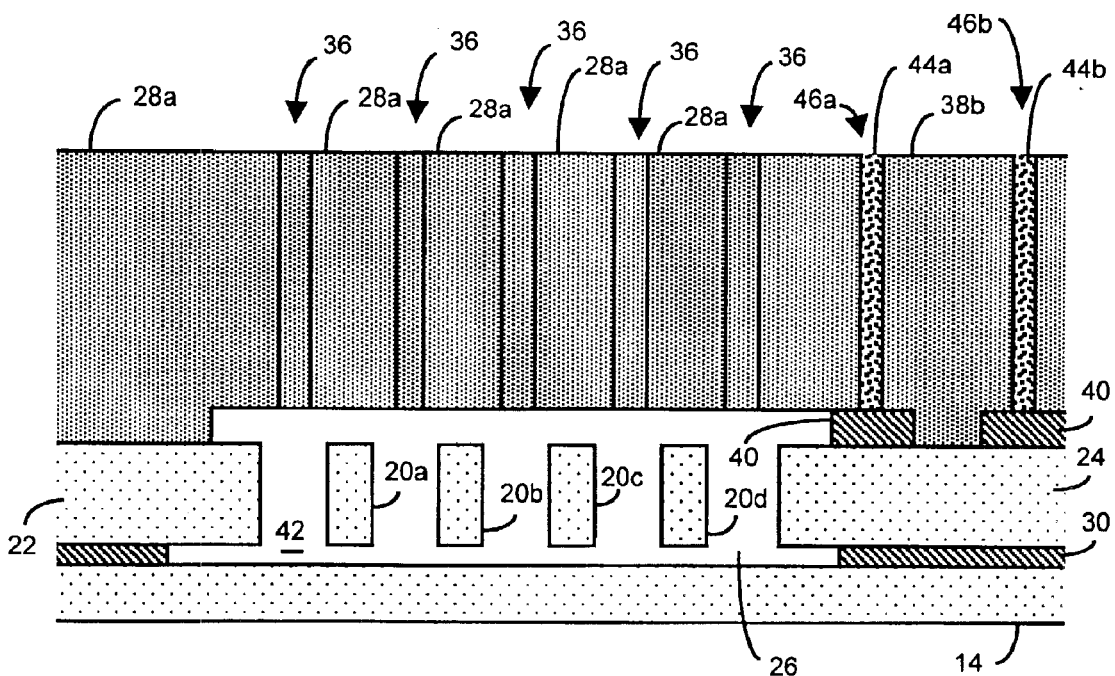

With reference to FIGS. 8A–E, dielectric isolation regions 44a and 44b may include a slight taper in order to facilitate the formation of isolation regions 44a and 44b (see, FIG. 8B). In addition, dielectric isolation regions 44a and 44b may include a plurality of materials, including, for example, a first material 44aa (for example, silicon dioxide, silicon nitride, BPSG, PSG, or SOG) and a second material 44ab (for example, a silicon based material, for example, a polycrystalline silicon). In this way, an electrical isolation is provided by way of insulating material 44aa while a limited amount of dielectric is exposed to the surface (see, for example FIGS. 8C–D) of micromachined mechanical structure 12.

It should be noted that dielectric isolation regions 44a and 44b of FIGS. 8A–E may be employed in any of micromachined mechanical structure 12 described herein. For the sake of brevity, the discussion pertaining to FIGS. 8A–E will not be repeated for each embodiment of micromachined mechanical structure 12.

In another embodiment, vents 36 and trenches 46a and 46b may be formed serially or at the same time. In one embodiment, with reference to FIG. 9A, a "thick" deposition of encapsulation layer 28a is deposited, formed and/or grown. The vents 36 may be etched, as described above, to facilitate removal of portions of first and second sacrificial layers 30 and 32 (see, FIG. 9B). The vents 36 may be filled by way of second encapsulation layer. Thereafter, trenches 46a and 46b may be etched (see, FIG. 9C) and filled, (see, FIG. 9D), as described above. Notably, chamber 26 may be "sealed" or encapsulated (FIG. 9C), and dielectric isolation regions 44a and 44b formed (FIG. 9D) using any of the techniques described above.

In another embodiment, dielectric isolation regions 44a and 44b may be formed or completed while processing the "back-end" of the integrated circuit fabrication of MEMS 10. In this regard, with reference to FIG. 10A, during deposition, formation and/or growth of insulation layer 48, trenches 46a and 46b may also be etched and filled to form dielectric isolation regions 44a and 44b. Thereafter, a contact opening 50 is etched to facilitate electrical connection to contact area 24, via contact plug 38a (see, FIG. 10B). A low resistance layer 52 may then be deposited to provide the appropriate electrical connection to contact 24 (see, FIG. 10C).

Figure 10A:
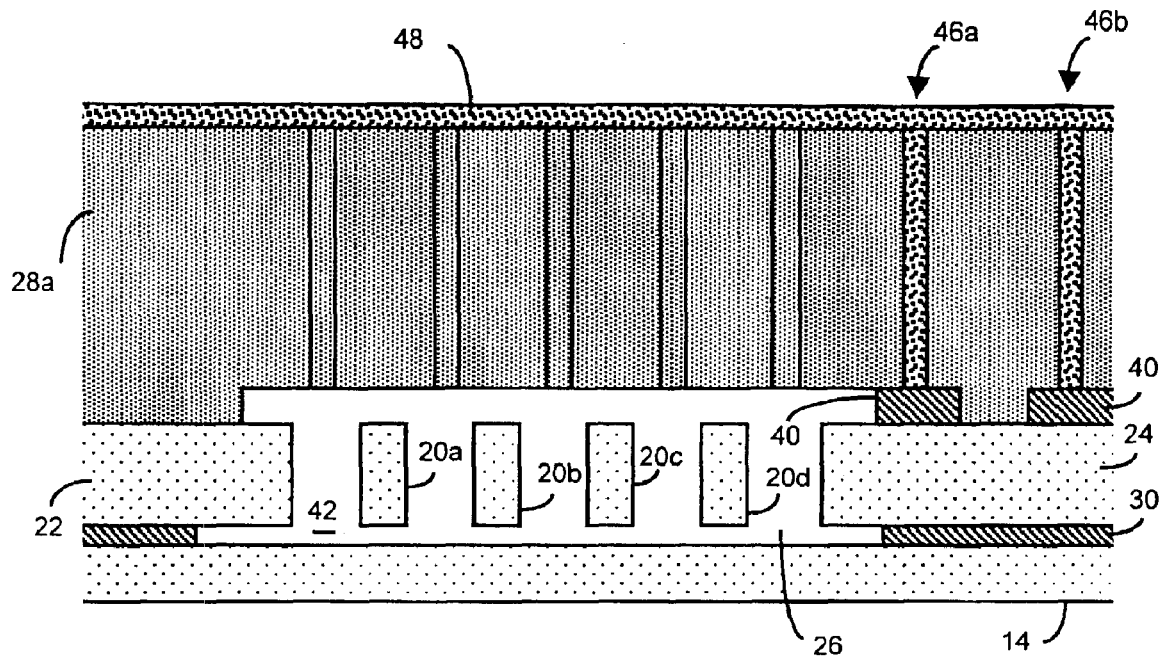
Figure 10B:
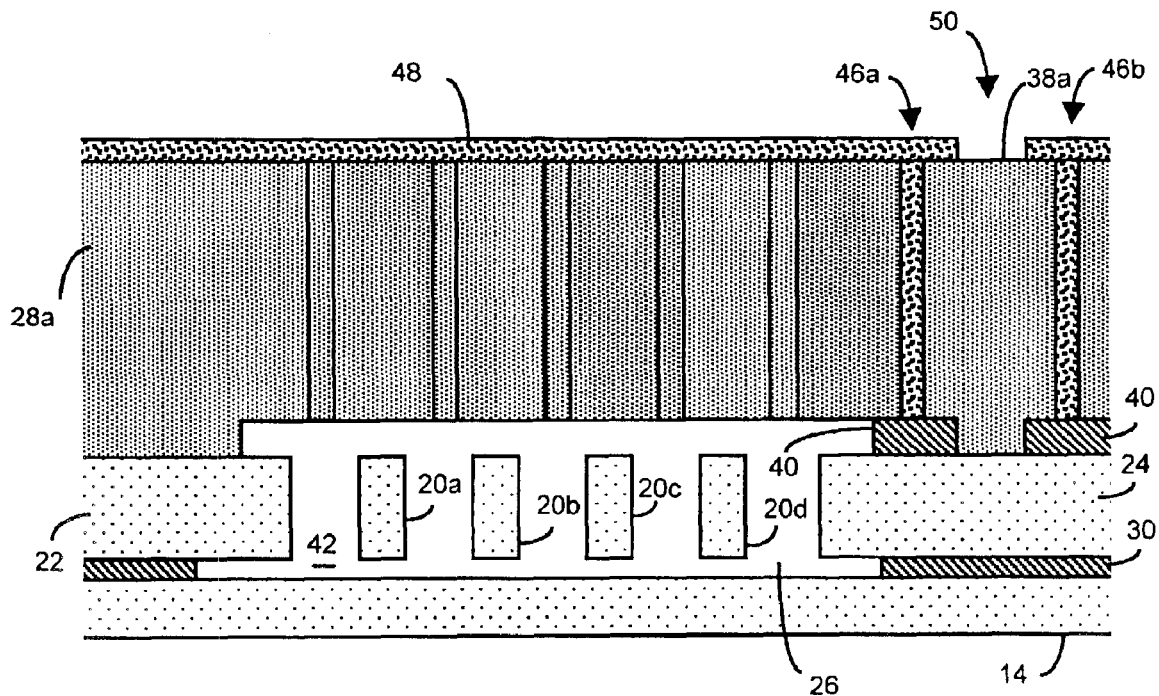
Figure 10C:
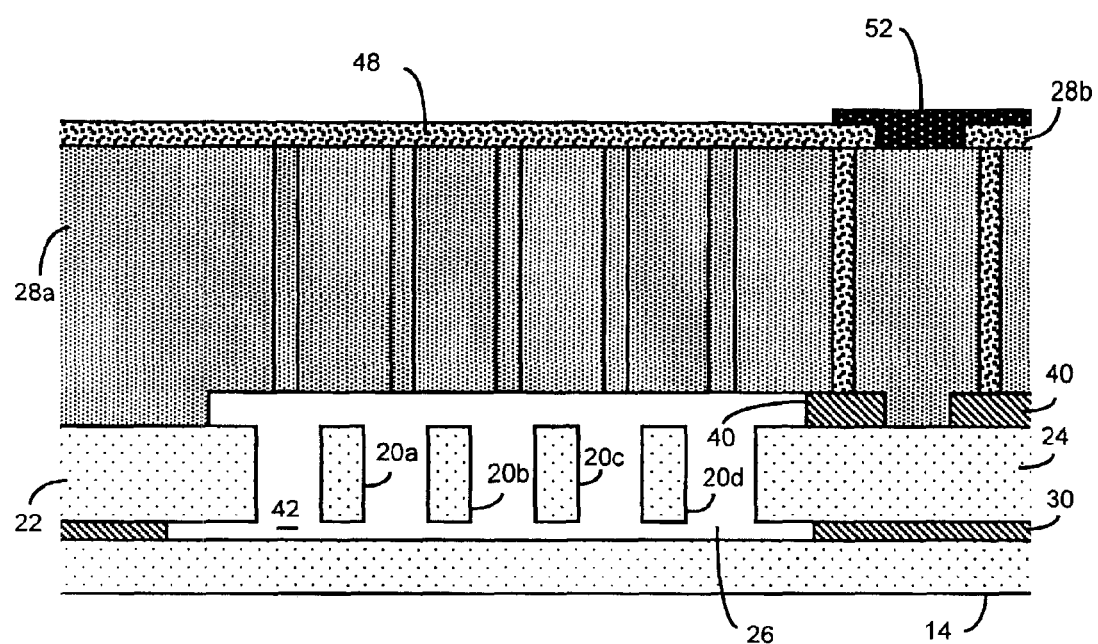

Thus, in the embodiment of FIGS. 10A–C, the processing pertaining to the dielectric isolation regions 44a and 44b may be "combined" with the insulating and contact formation step of the "back-end" of the integrated circuit fabrication of MEMS 10. In this way, fabrication costs may be reduced.

With reference to FIGS. 11A–D, in another set of embodiments, first encapsulation layer 28a may be a permeable or semi-permeable material (for example, an amorphous sputtered silicon or porous CVD and/or epitaxial deposited polycrystalline silicon). In this set of embodiments, the process of etching or removing layers 30 and 32 may be performed through the permeable or semi-permeable material comprising layer 28a. Thereafter, when depositing, forming and/or growing second encapsulation layer 28b (for example, polycrystalline silicon) on first encapsulation layer 28a, the material may migrate to, fill and/or occupy the pores of first encapsulation layer 28a. Under this circumstance, relatively little material may deposit on the surfaces of the structures within chamber 26 during deposition, formation and/or growth of second encapsulation layer 28b. As such, chamber 26 may be "sealed" or encapsulated towards the upper surfaces of first encapsulation layer 28a (i.e., the surface that are first exposed to the deposition, formation and/or growth process).

The processing pertaining to forming dielectric isolation regions 44a and 44b (FIGS. 11C and 11D) may employ any of the techniques described above. For the sake of brevity that discussion will not be repeated.

It should be noted that it may be advantageous to deposit and form material 40 on the upper surface of contact area 24 that is not removed or etched when layers 30 and 32 are removed during the etching process. In this way, the material disposed next to or near opening 34 is not removed and it may function as an etch stop during processing of trenches 46a and 46b. For example, layers 30 and/or 32 may be a silicon dioxide and material 40 may be a silicon nitride.

In one embodiment, where the permeable or semi-permeable material is an amorphous sputtered silicon or porous CVD deposited polycrystalline silicon, having a thickness of between 0.1 $\mu$m and 2 $\mu$m. After etching and/or removal of layers 30 and 32, second encapsulation layer 28b may be a thickness of between 5 $\mu$m and 25 $\mu$m.

Figure 11A:
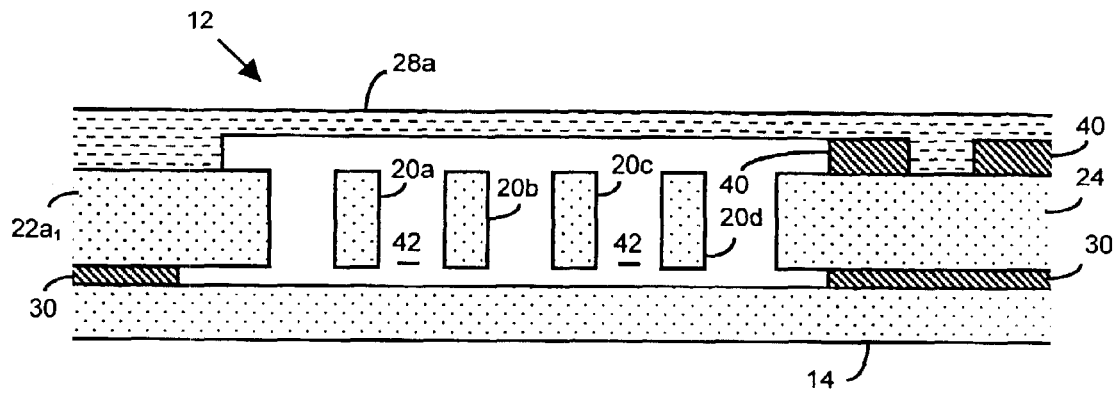
FIGS. 11A–D illustrate cross-sectional views of the fabrication of the microstructure at various stages of the process where the first encapsulation layer is a permeable material.
Figure 11B:
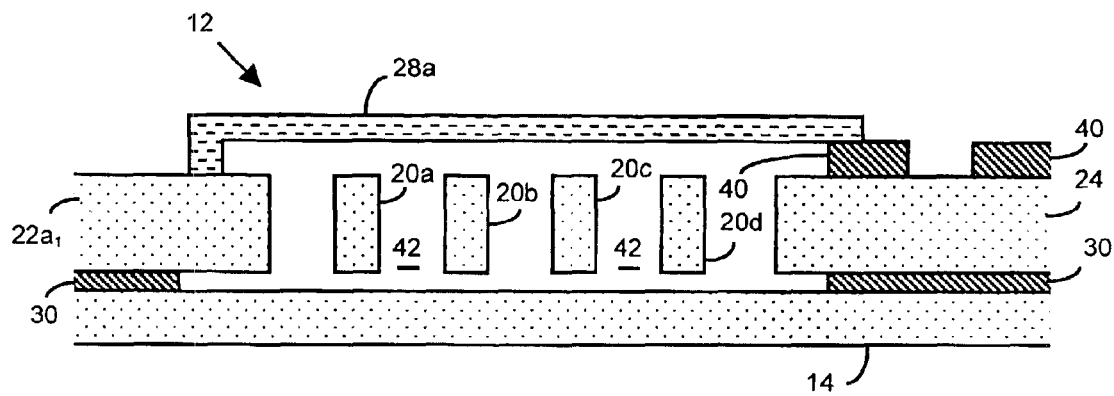
Figure 11C:
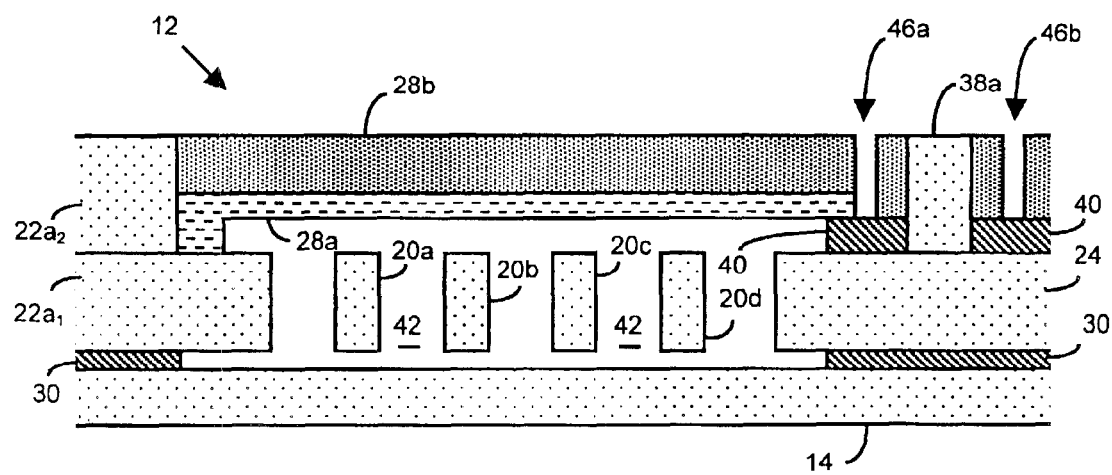
Figure 11D:
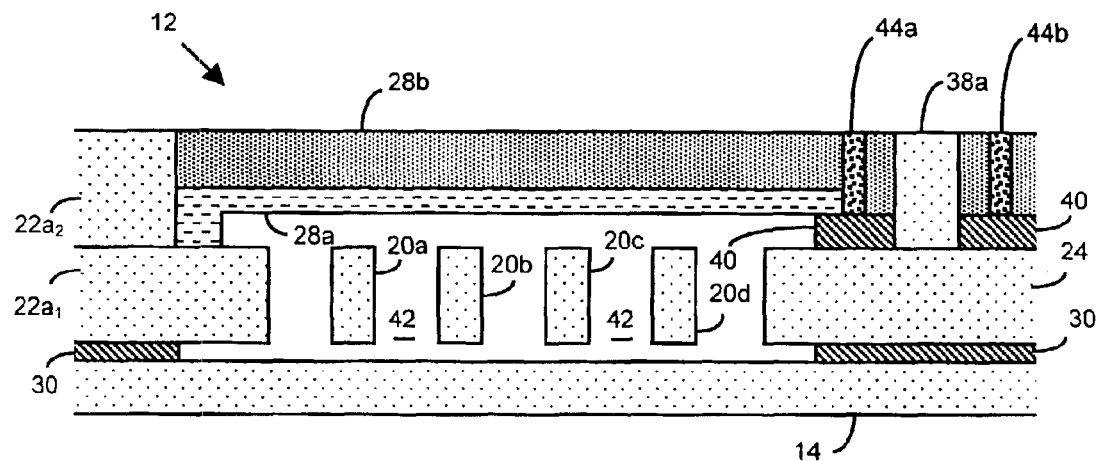

With reference to FIG. 11B, the material comprised of first encapsulation layer 28a may also be densified and thereby "closed" and chamber 26 "sealed" using an annealing process. That is, in this embodiment, heat treating micromachined mechanical structure 12, after etching first and second sacrificial layers 30 and 32, may cause the material of layer 28a to densify thereby sealing or encapsulating chamber 26. As such, a second encapsulation layer 28b may not be necessary to seal chamber 26.

Figure 12:
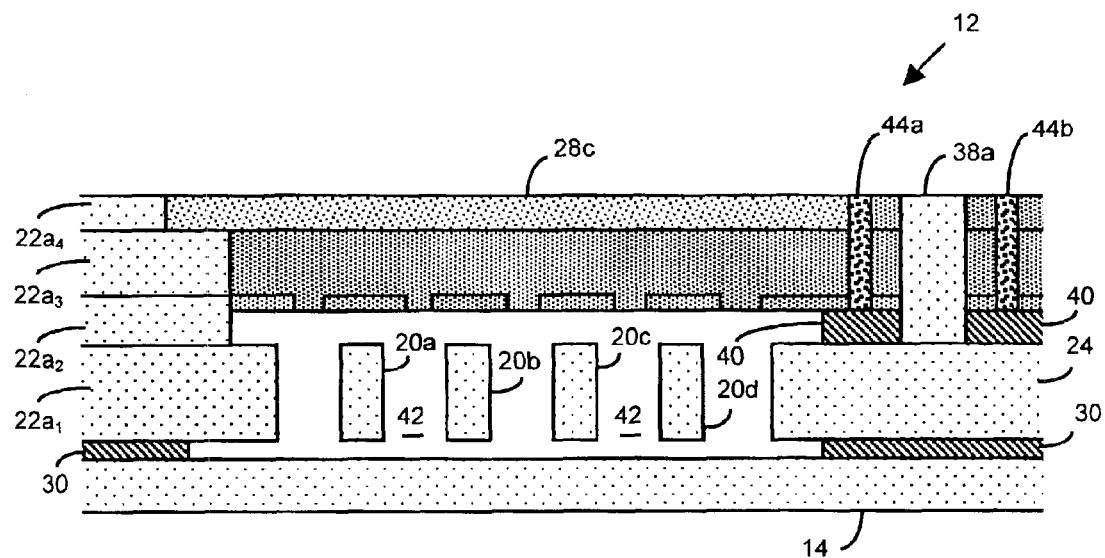
FIG. 12 illustrates a cross-sectional view of the interdigitated or comb-like finger electrode array microstructure of FIG. 2, sectioned along dotted line a—a, in accordance with another aspect of the present invention including three or more encapsulation layers.

With reference to FIG. 12, the encapsulation process of chamber 26 may include three or more encapsulation layers. The second encapsulation layer 28b and third encapsulation layer 28C (or subsequent/additional layers) may be deposited, formed and/or grown to "seal" chamber 26. In particular, second encapsulation layer 28b may be, for example, a semiconductor material (for example, silicon, silicon carbide, silicon-germanium or germanium) or metal bearing material (for example, silicides or TiW), which is deposited using, for example, an epitaxial, a sputtering or a CVD-based reactor (for example, APCVD, LPCVD or PECVD). The deposition, formation and/or growth may be by a conformal process or non-conformal process. The material comprising encapsulation layer 28b may be the same as or different from first encapsulation layer 28a.

Thereafter, third encapsulation layer 28c may be deposited, formed and/or grown. The third encapsulation layer 28c may "seal" or close, or more fully "seal" or close chamber 26. The deposition, formation and/or growth of third encapsulation layer 28c may be the same as, substantially similar to, or different from that of encapsulation layers 28a and/or 28b. In this regard, third encapsulation layer 28c may be comprised of, for example, a semiconductor material, an insulator material (for example, silicon nitride or silicon oxide), plastic (for example, photo resist or low-K dielectric) or metal bearing material. The third encapsulation layer 28c may be deposited and/or formed using, for example, an epitaxial, a sputtering or a CVD-based reactor (for example, APCVD, LPCVD or PECVD). The deposition, formation and/or growth process may be conformal or non-conformal.

It should be further noted that encapsulation layer 28c (see, for example, FIG. 12) may be deposited, formed and/or grown to, for example, provide a more planar surface, an etch stop layer for subsequent processing, an insulation layer, a ground plane, a power plane, and/or enhance the "seal" of chamber 26 and thereby enhance the barrier to diffusion of fluid 42.

Depending upon the purpose or function of encapsulation layer 28c, it may be, for example, a semiconductor material (for example, a polycrystalline silicon, silicon carbide, silicon/germanium or germanium), an insulator material (for example, silicon dioxide, silicon nitride, BPSG, PSG, or SOG) or metal bearing material (for example, silicides). The encapsulation layer 28c may be, for example, deposited, formed or grown using, for example, an epitaxial, a sputtering or a CVD-based reactor (for example, APCVD, LPCVD or PECVD). The deposition, formation and/or growth may be by a conformal process or non-conformal process. The material comprising encapsulation layer 28c may be the same as or different from the other encapsulation layers.

The encapsulation process employing three or more layers may be applied to any of micromachined mechanical structure 12 described and illustrated herein. For the sake of brevity, the discussion pertaining to FIG. 12 will not be repeated for each embodiment of micromachined mechanical structure 12.

The environment (for example, the gas or gas vapor pressure) within chamber 26 determines to some extent the mechanical damping for mechanical structures 20a–d. In this regard, chamber 26 includes fluid 42 that is "trapped", "sealed" and/or contained within chamber 26. The state of fluid 42 within chamber 26 (for example, the pressure) may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application").

The inventions described and illustrated in the Electromechanical System having a Controlled Atmosphere Patent Application may be implemented with any and all of the inventions described and illustrated in this application. For example, the encapsulation techniques described above may be implemented with techniques described in the Electromechanical System having a Controlled Atmosphere Patent Application to trap and/or seal a fluid having a selected, desired and/or predetermined state within the chamber. In this way, the fluid provides a desired, predetermined, appropriate and/or selected mechanical damping for mechanical structures within the chamber.

Figure 13A:
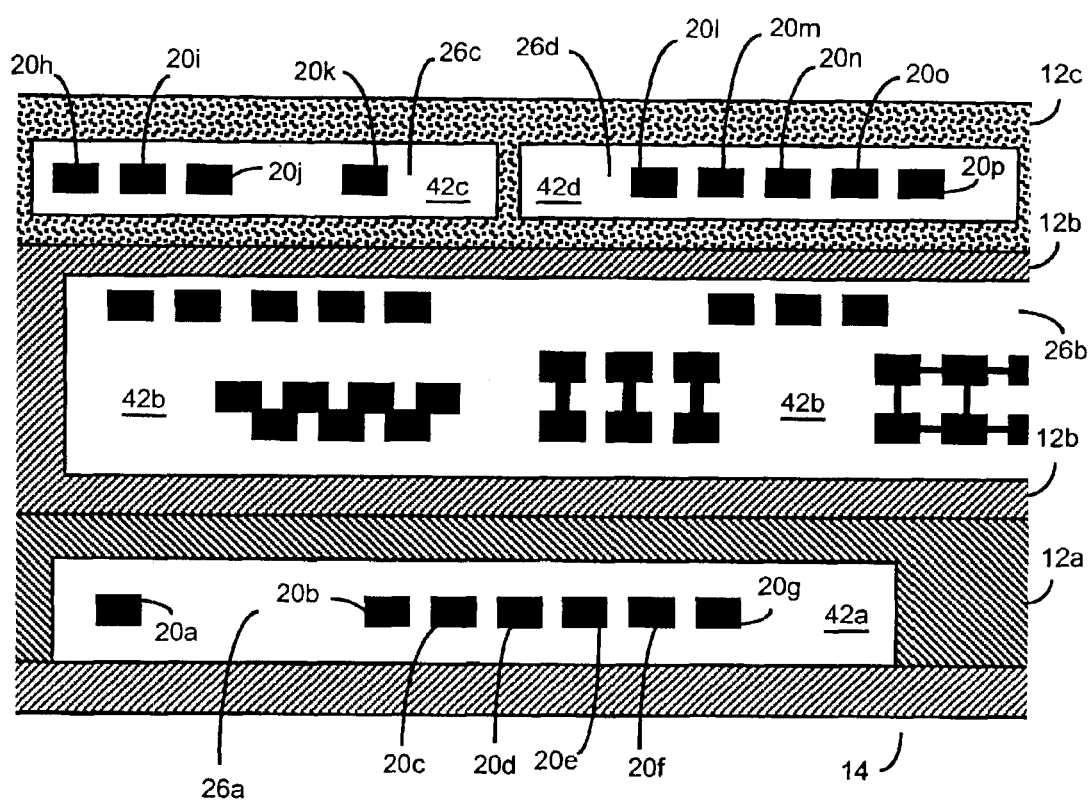
FIG. 13A illustrates a cross-sectional view of a portion of a plurality of micromechanical structures, each having one or more electromechanical systems, which are monolithically integrated on or within the substrate of a MEMS, in accordance with certain aspect of the present invention.

As another example, the Electromechanical System having a Controlled Atmosphere Patent Application describes a MEMS that includes a plurality of monolithically integrated micromachined mechanical structures having one or more electromechanical systems (for example, gyroscopes, resonators, temperature sensors and/or accelerometers). With reference to FIGS. 13A, in one embodiment, MEMS 10 includes a plurality of micromachined mechanical structures 12a–c that are monolithically integrated on or disposed within substrate 14. Each micromachined mechanical structure 12a–c includes one or more mechanical structures 20a–p (for the sake of clarity only a portion of which are numbered) that are disposed in chambers 26a–d.

In certain embodiments, chambers 26a–d are sealed or encapsulated using the techniques described above. The chambers 26a–d may be sealed or encapsulated in the same or substantially the same manner or using differing techniques. In this way, the plurality of structures 12a–d may be fabricated in ways that provide the same, substantially the same, different or substantially different desired, predetermined, appropriate and/or selected mechanical damping for mechanical structures 20a–p.

Indeed, in at least one embodiment, structure 12c includes a plurality of chambers, namely chambers 26c and 26d, each containing fluid 42c and 42d, respectively. The chambers 22c and 22d may be sealed or encapsulated in a manner that fluids 42c and 42d, respectively, are maintained at the same or substantially the same selected, desired and/or predetermined states. As such, in this embodiment, fluids 42c and 42d may provide the same or substantially the same desired, predetermined, appropriate and/or selected mechanical damping for mechanical structures 20h–k and 20l–p, respectively.

Alternatively, in at least another embodiment, chambers 26c and 26d may be sealed or encapsulated using different or differing techniques such that fluids 24c and 24d may be "trapped", "sealed", maintained and/or contained in chambers 26c and 26d, respectively, at different or substantially different selected, desired and/or predetermined states. In this embodiment, chambers 26c and 26d may be "sealed" using different processing techniques, different processing conditions and/or different materials (for example, gases or gas vapors). As such, after encapsulation, fluids 42c and 42d provide different or substantially different mechanical damping characteristics for mechanical structures 20h–k and 20l–p, respectively. In this way, micromachined mechanical structure 12c may include different electromechanical systems (for example, gyroscopes, resonators, temperature sensors and accelerometers) that require different or substantially different mechanical damping characteristics for optimum, predetermined, desired operation.

For the sake of brevity, all of the inventions described and illustrated in the Electromechanical System having a Controlled Atmosphere Patent Application will not be repeated here. It is expressly noted, however, that the entire contents of the Electromechanical System having a Controlled Atmosphere Patent Application, including for example, the features, attributes, alternatives, materials, techniques and advantages of all of the inventions, are incorporated by reference herein.

Figure 14A:
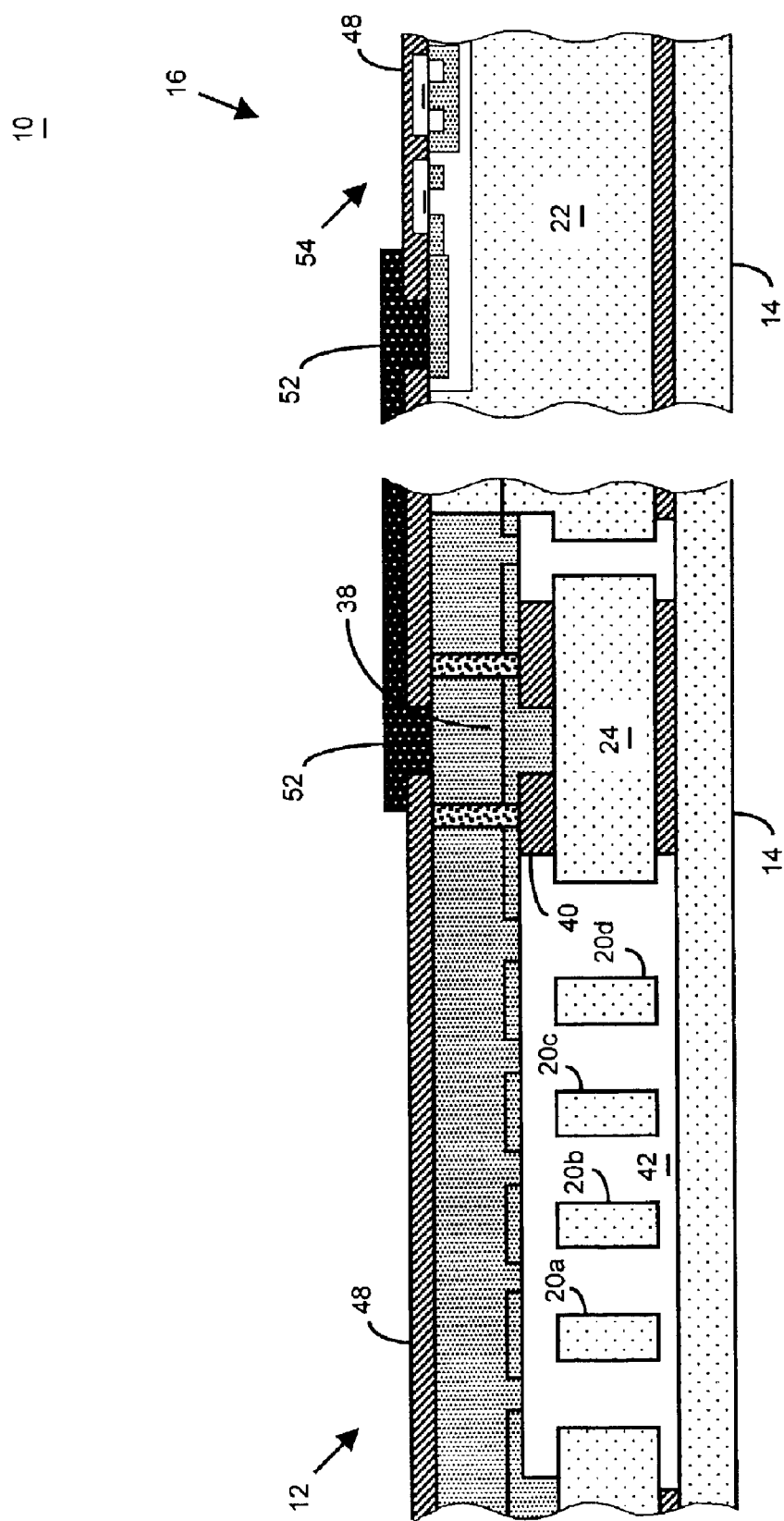
FIG. 14A–14E illustrate cross-sectional views of MEMS, according to certain aspects of the present inventions, including a micromachined mechanical structure portion and an integrated circuit portion, both portions of which are disposed or integrated on a common substrate.
Figure 14B:
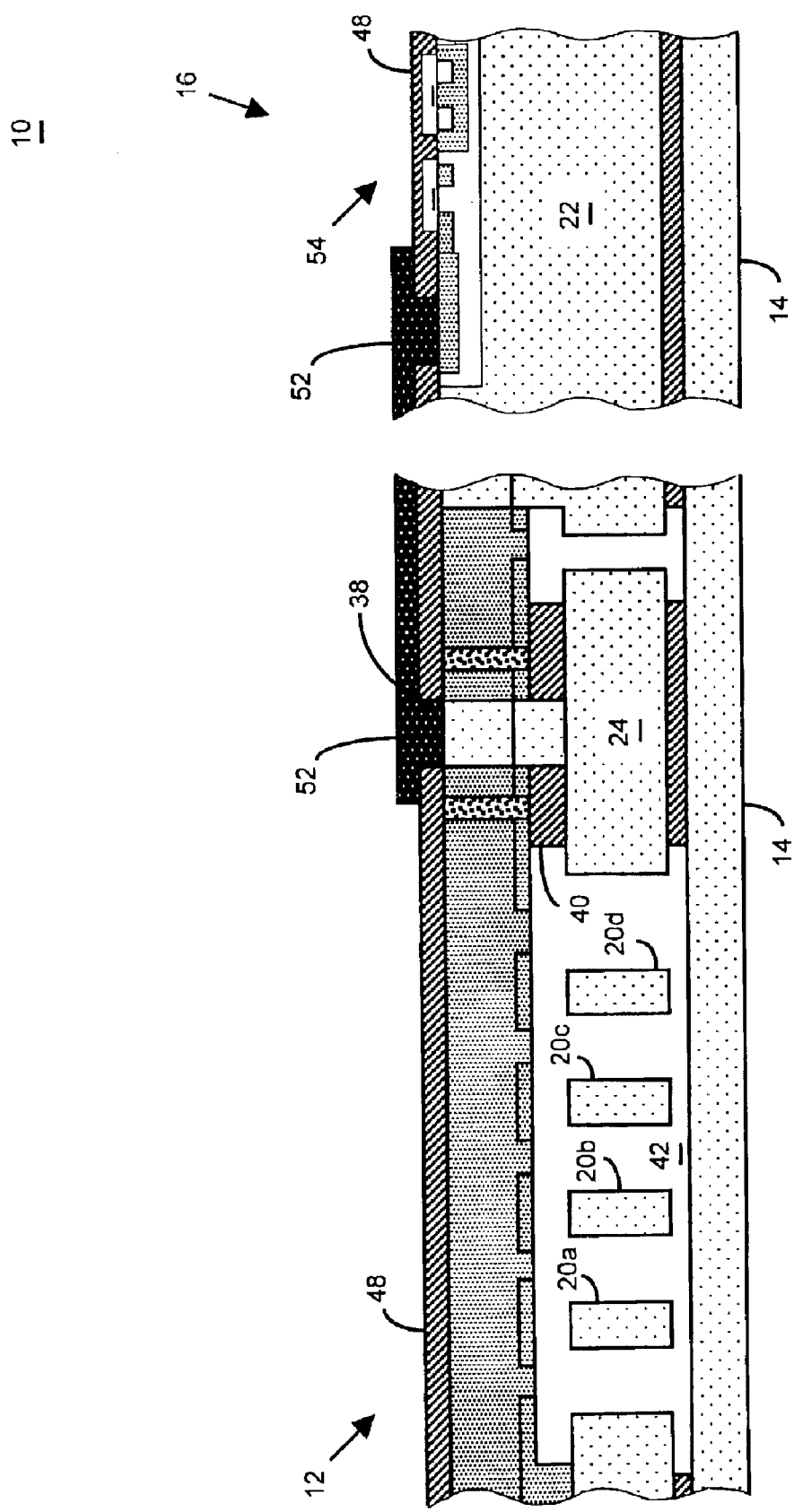
Figure 14C:
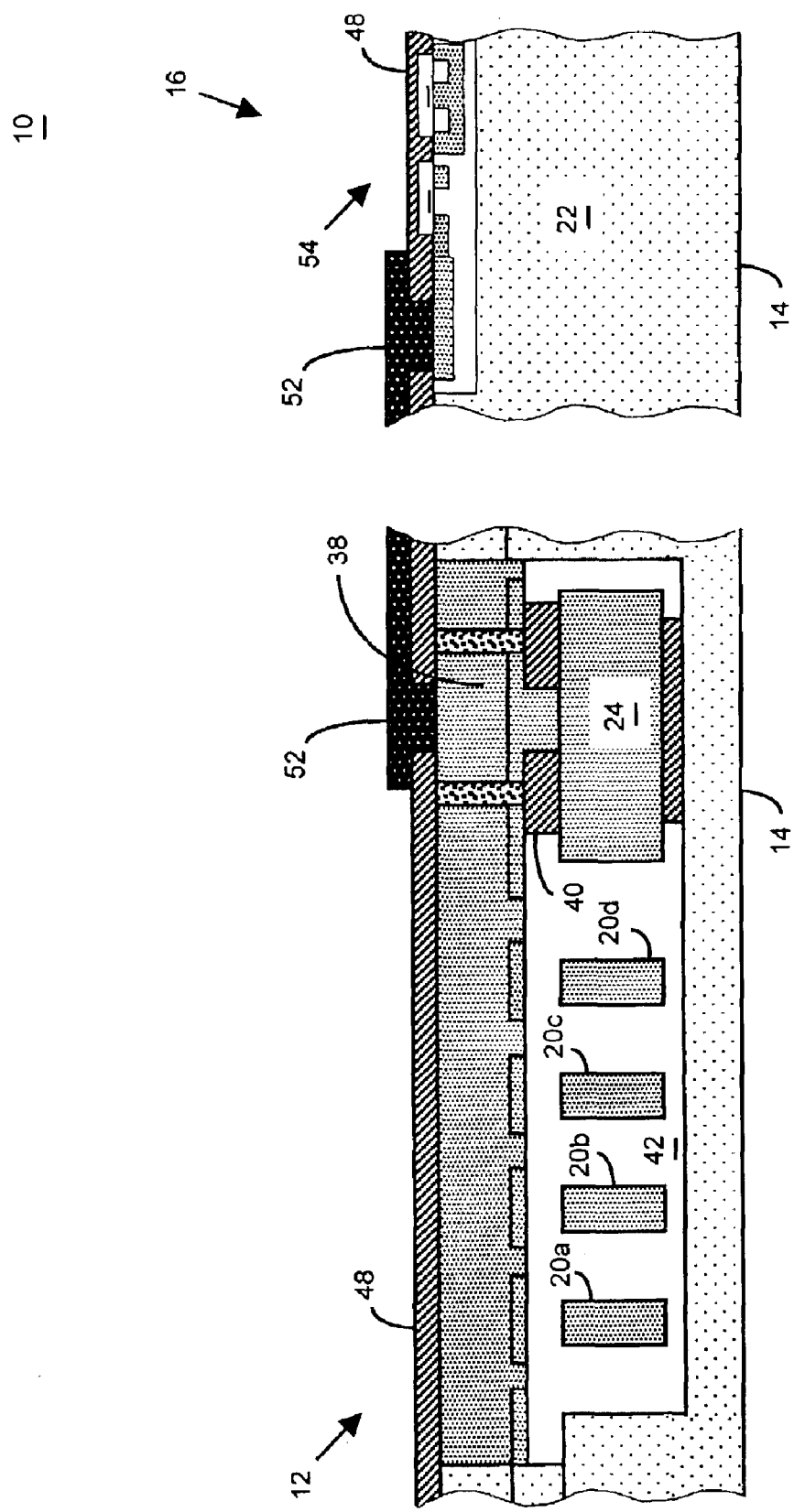
Figure 14D:
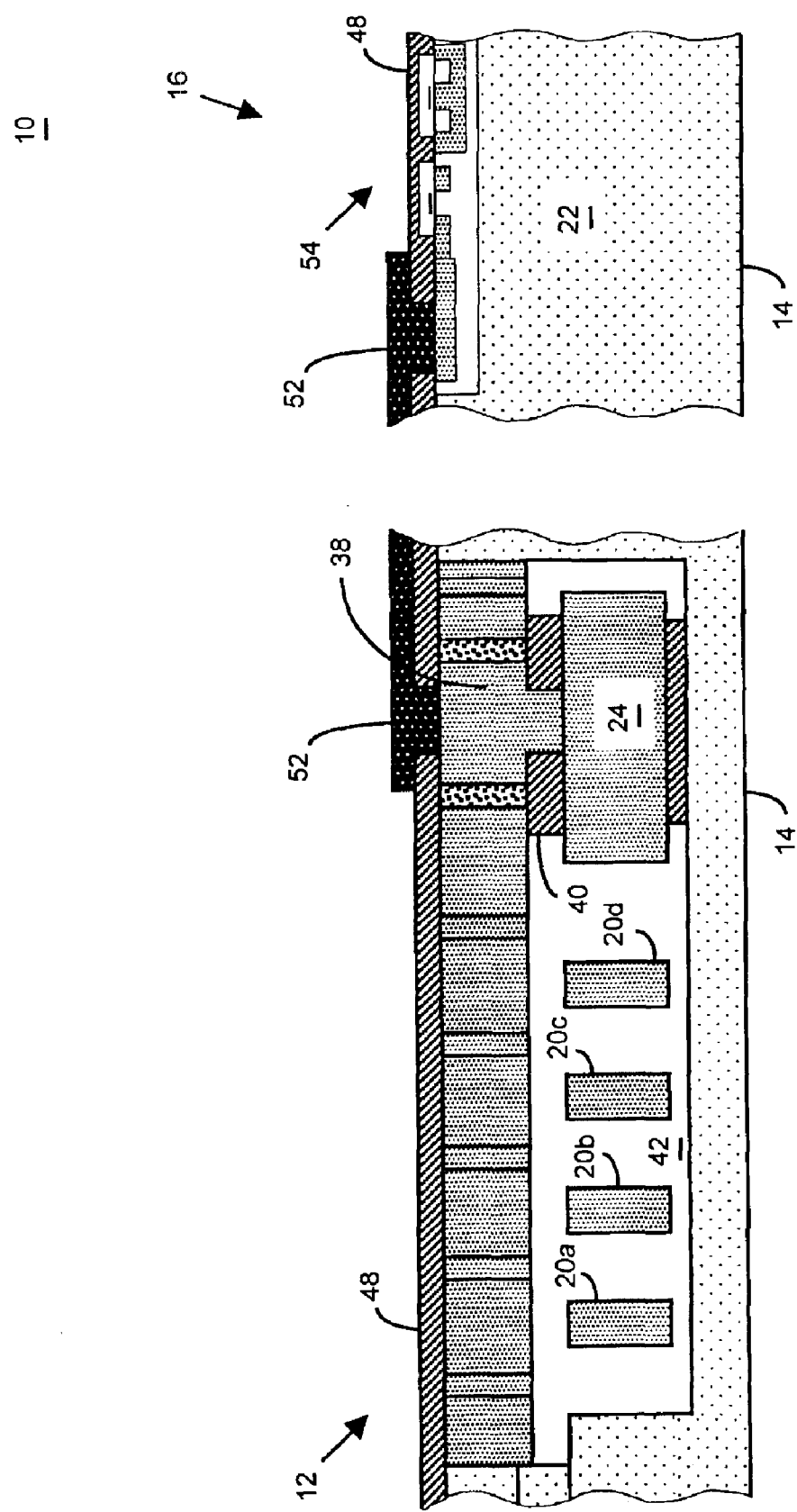
Figure 14E:
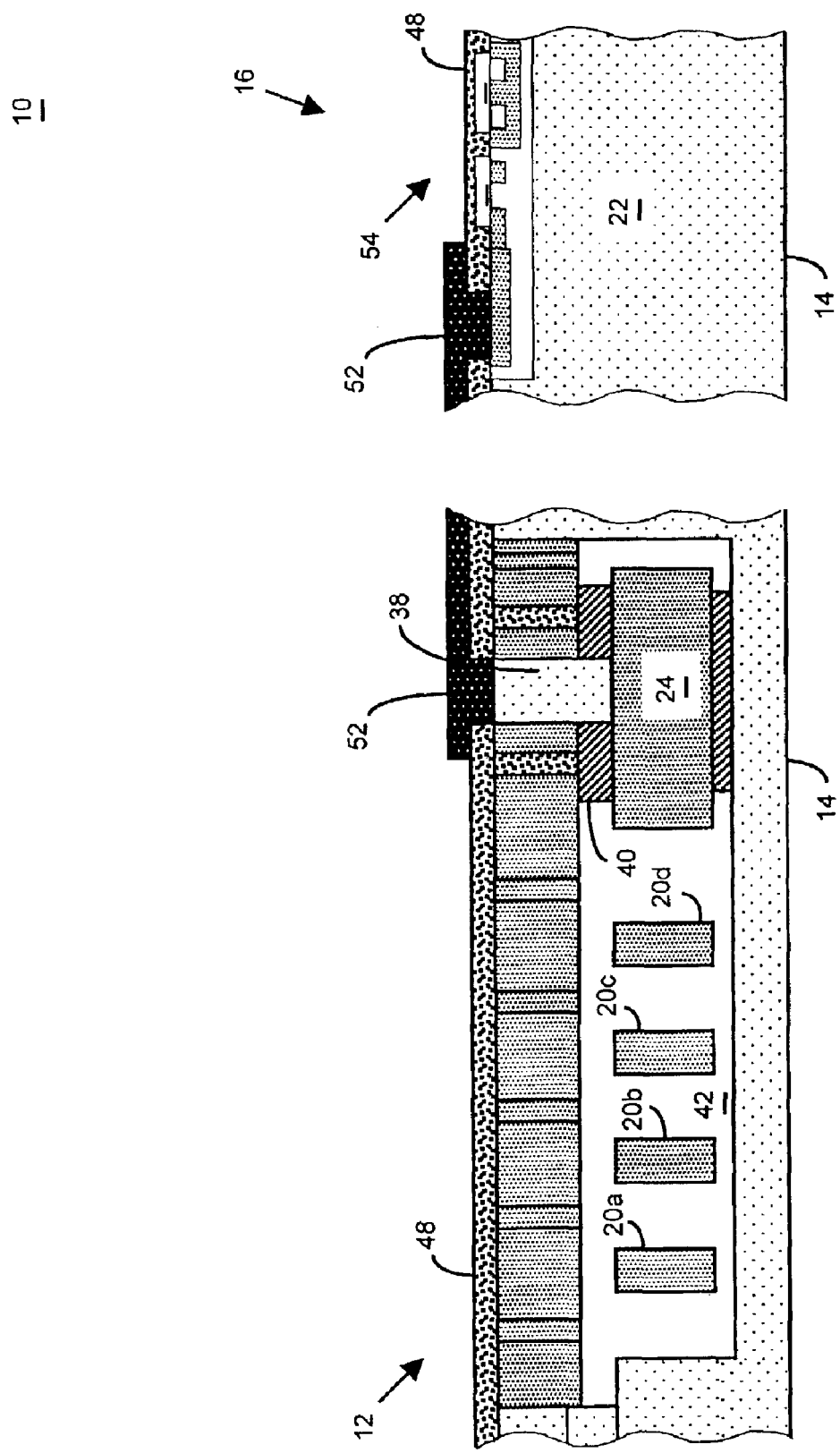

As mentioned above, in one set of embodiments, a monolithic structure may include mechanical structure 12 and data processing electronics 16 and/or interface circuitry 18 that are integrated on or in a common substrate. With reference to FIGS. 14A–14E, MEMS 10 includes micromachined mechanical structure 12, having structures 20a–20d and contact area 24, as well as data processing electronics 16, including integrated circuits 54 disposed in field region 22. As mentioned above, mechanical structures 20a–20d (and contact 24) may be formed from, for example, a single crystalline material (FIGS. 14, 14B and 14E) or a polycrystalline material (FIGS. 14C and 14D). Moreover, contact via 38 may also be formed from, for example, primarily a single crystalline material (FIGS. 14B and 14E) or primarily a polycrystalline material (FIGS. 14A, 14C and 14D).

It should be noted that mechanical structure 12 may be electrically connected to integrated circuits 54 via low resistance layer 52. The integrated circuits 54 may be fabricated using conventional techniques.

In particular, in those instances where contact 24 is accessed directly by integrated circuitry 54, it may be advantageous to provide a low resistance electrical path. The insulation layer 48 may be deposited, formed and/or grown and patterned to provide or. facilitate interconnection with contact area 24. Thereafter, a low resistance layer 52 (for example, a heavily doped polysilicon or metal such as aluminum, chromium, gold, silver, molybdenum, platinum, palladium, tungsten, titanium, and/or copper) is formed.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 13B:
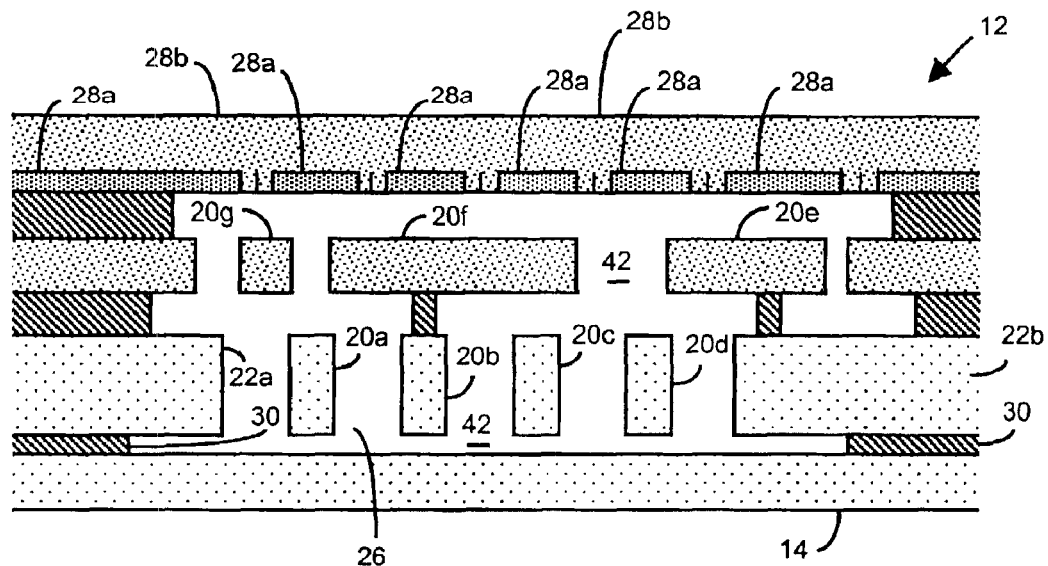
FIG. 13B, 13C and 13D illustrate cross-sectional views of a portion of a micromechanical structure, having a plurality of microstructures, which are monolithically integrated on or within the substrate of a MEMS, in accordance with certain aspect of the present invention.
Figure 13C:
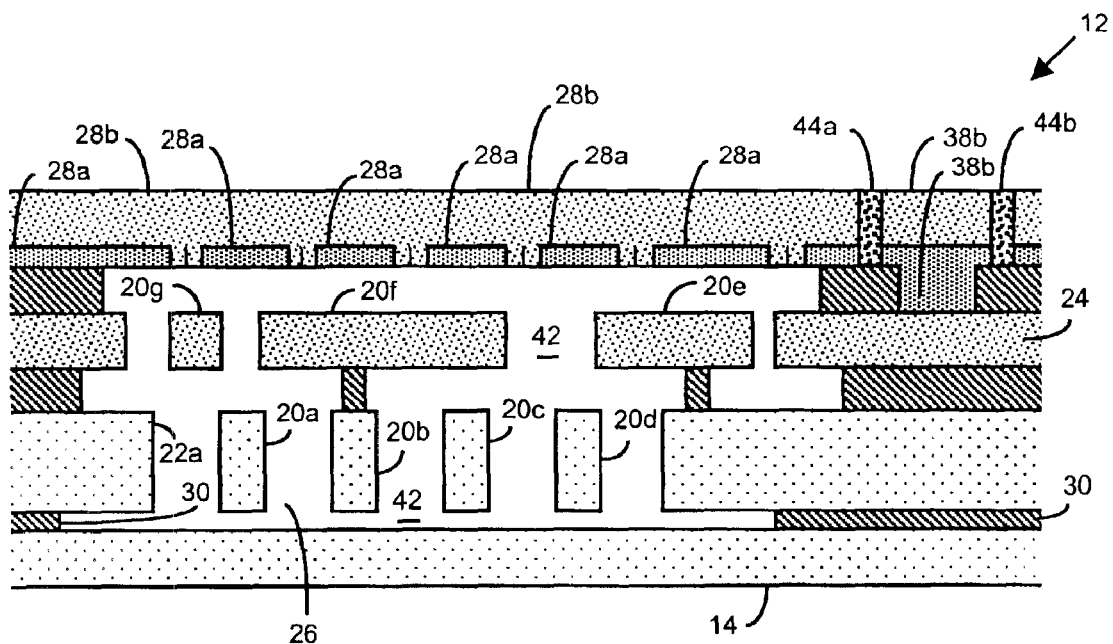
Figure 13D:
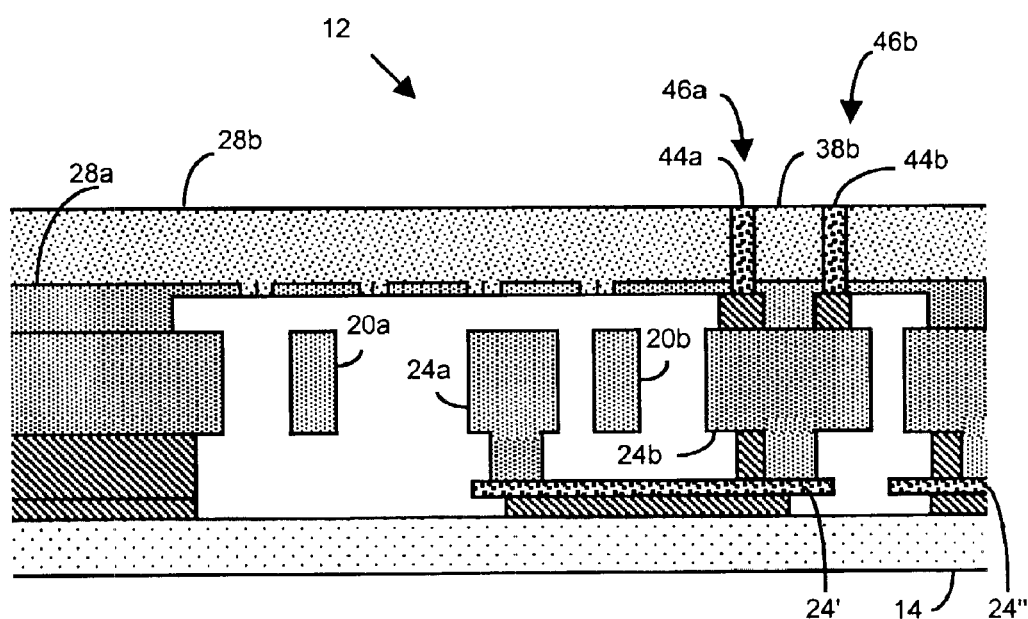

For example, any and all of the embodiments illustrated and described herein may include multiple layers of mechanical structures, contacts areas and buried contacts that are vertically and/or laterally stacked or interconnected (see, for example, micromachined mechanical structure 12 of FIGS. 13B, 13C and 13D). Moreover, single layer and multiple layers of mechanical structures may be themselves be vertically and/or laterally stacked or interconnected (see, for example, micromachined mechanical structure 12b of FIG. 13A). Further, the resulting micromachined mechanical structure 12 may be integrated with integrated circuitry 54 on a common substrate 14. Any vertical and/or lateral location of micromachined mechanical structure 12, relative to integrated circuitry 54, may be suitable.

In addition, it should be noted that rather than depositing an insulation material in trenches 46a and 46b, it may be advantageous to deposit an oppositely doped material that would form or create a junction isolation between the contact area and the surrounding conductive materials. In this regard, the material deposited in trenches 46a and 46b may doped with impurities having an opposite conductivity relative to the impurities in first encapsulation layer 28a and/or second encapsulation layer 28b. For example, first encapsulation layer 28a may be doped with boron and the material deposited in trenches 46a and 46b may be doped with phosphorous. In this way, upon completion of the sealing or encapsulation process, junctions surrounding electrical contact area 24 are formed which electrically "isolate" contact area 24 from, for example, field region 22b.

Thereafter, in another set of embodiments, micromachined mechanical structure 12 may be substantially planarized using, for example, polishing techniques (for example, chemical mechanical polishing ("CMP")). In this regard, it may be advantageous to remove the layer of material used to fill trenches 46a and 46b that forms on the encapsulation layer(s) so that contact via 38 is electrically isolated by oppositely doped materials.

Figure 15:
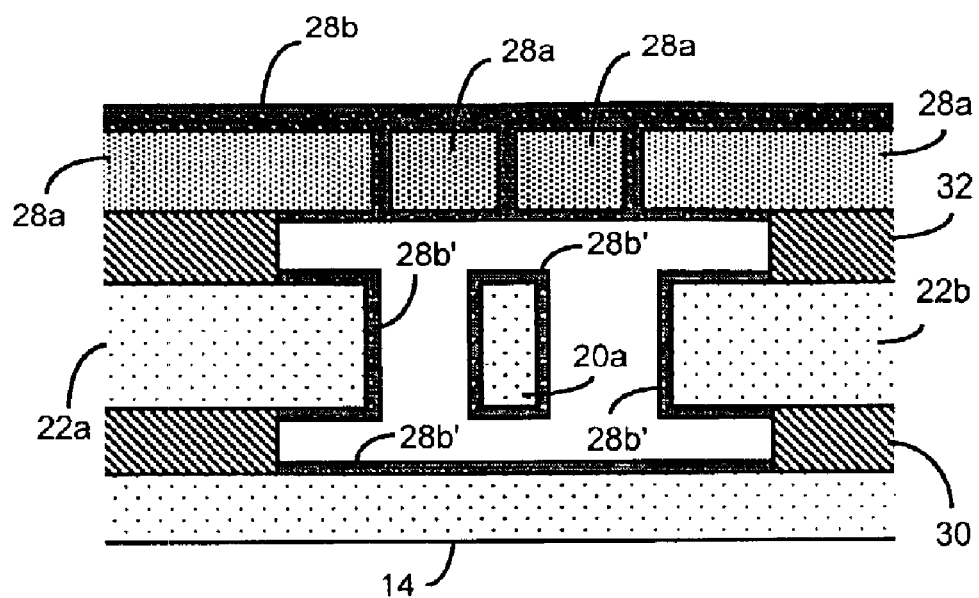
FIG. 15 illustrates a cross-sectional view of a portion of a micromachined micromechanical structure, having a microstructure, which includes a layer of the second encapsulation layer deposited thereon.

Moreover, with reference to FIG. 15, in those instances where the material comprising a second or subsequent encapsulation layer (for example, second encapsulation layer 28b) deposits, forms or grows over selected surfaces of the structures in chamber 26 (for example, the surfaces of mechanical structures 20a–d and field areas 22a and 22b) as chamber 26 is sealed or encapsulated, it may be advantageous to design and fabricate mechanical structures 20a–d to account for the deposition, formation or growth of the additional material. The thickness of the additional material 28b' on the surfaces of mechanical structures 20a–d may be approximately equal to the width or diameter of vent 36. Accordingly, in one set of embodiments, the design (for example, thickness, height, width and/or lateral and/or vertical relation to other structures in chamber 36) of mechanical structures 20a–d incorporates therein such additional material 28b' and the fabrication of mechanical structures 20a–d to provide a final structure includes at least two steps. A first step which fabricates mechanical structures 20a–d according to initial dimensions (for example, as described above with respect to FIGS. 4A and 4B) and a second step that includes the deposition, formation or growth of material 28b' as a result of deposition, formation or growth of at least one encapsulation layer, for example, second encapsulation layer 28b and/or subsequent encapsulation layer.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)).

Further, in the claims, the term "contact" means a conductive region partially or wholly disposed outside the chamber, such as the contact area and/or contact via.

Finally, it should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics.

What is claimed is:

1. A method of sealing a chamber of a microelectromechanical device having a micromechanical structure and a contact wherein the micromechanical structure is in a chamber, the method comprising:

depositing a sacrificial layer over at least a portion of the micromechanical structure;

depositing a first encapsulation layer over the sacrificial layer;

forming at least one vent through the first encapsulation layer to allow removal of at least a portion of the sacrificial layer;

removing at least a portion of the sacrificial layer to form the chamber;

depositing a second encapsulation layer over or in the vent to seal the chamber wherein the second encapsulation layer is a semiconductor material;

forming a trench around at least a portion of the contact which is disposed outside the chamber; and depositing an insulating material in the trench to electrically isolate the contact.

2. The method of claim 1 wherein the semiconductor material includes polycrystalline silicon, porous polycrystalline silicon. amorphous silicon, silicon carbide, silicon/germanium, germanium, or gallium arsenide.

3. The method of claim 2 wherein the first encapsulation layer includes polycrystalline silicon, porous polycrystalline silicon, amorphous silicon, germanium, silicon/germanium or gallium arsenide.

4. The method of claim 1 wherein the trench surrounds the contact to electrically isolate the contact.

5. The method of claim 1 further including depositing a semiconductor material in the trench after depositing the insulating material.

6. The method of claim 1 further including planarizing an exposed surface of the trench.

7. The method of claim 1 wherein the insulating material is silicon dioxide or silicon nitride.

8. The method of claim 1 further including:

depositing an insulating layer on at least a portion of the trench;

depositing an highly conductive material on the contact and over the insulating layer.

9. A method of manufacturing a microelectromechanical device having a micromechanical structure that resides in a chamber and wherein the microelectromechanical device further includes a contact, the method comprising:

depositing a first encapsulation layer over the micromechanical structure wherein the first encapsulation layer is a semiconductor material;

forming at least one vent in the first encapsulation layer;

forming the chamber;

depositing a second encapsulation layer over or in the vent to seal the chamber wherein the second encapsulation layer is a semiconductor material;

forming a trench around at least a portion of the contact wherein the trench and at least the portion of the contact are disposed outside the chamber; and depositing a first material in the trench to electrically isolate the contact.

10. The method of claim 9 wherein the first encapsulation layer includes polycrystalline silicon, porous polycrystalline silicon, amorphous silicon, silicon carbide, silicon/germanium, germanium, or gallium arsenide.

11. The method of claim 9 wherein the first material is silicon dioxide or silicon nitride.

12. The method of claim 9 wherein the second encapsulation layer includes polycrystalline silicon, porous polycrystalline silicon, amorphous silicon, silicon carbide, silicon/germanium, germanium, or gallium arsenide.

13. The method of claim 9 wherein the trench surrounds the contact to electrically isolate the contact.

14. The method of claim 9 further including depositing a semiconductor material in the trench after depositing the first material and wherein the first material is disposed on the outer surfaces of the trench.

15. The method of claim 14 further including planarizing an exposed surface of the trench.

16. The method of claim 9 further including:

depositing an insulating layer on at least a portion of the trench;

depositing an highly conductive material on the contact and over the insulating layer.

17. The method of claim 1 wherein depositing an insulating material in the trench further includes depositing the insulating material substantially throughout the trench.

18. The method of claim 9 wherein depositing a first material in the trench further includes depositing the first material substantially throughout the trench.

19. A method of manufacturing an microelectromechanical device having a micromechanical structure that resides in a chamber, wherein the microelectromechanical device further includes a contact, the method comprising:

depositing a first encapsulation layer over the micromechanical structure;

depositing a second encapsulation layer on the first encapsulation layer and on the contact, wherein the second encapsulation layer is a semiconductor material;

forming a trench around at least a portion of the contact which is disposed outside the chamber;

depositing an insulating material in the trench, and on at least a first surface of the contact, and over the second encapsulation layer;

removing at least a portion of the insulating material that is disposed on the first surface of the contact to thereby expose a portion of the first surface of the contact; and depositing a conductive material on the exposed portion of the first surface of the contact.

20. The method of claim 19 wherein the first encapsulation layer includes polycrystalline silicon, porous polycrystalline silicon, amorphous silicon, silicon carbide, silicon/germanium, germanium, or gallium arsenide.

21. The method of claim 20 wherein the insulating material includes silicon dioxide or silicon nitride.

22. The method of claim 20 wherein the trench surrounds the contact to electrically isolate the contact from the second encapsulation layer.

23. The method of claim 20 further including depositing a semiconductor material in the trench after depositing the insulating material and wherein the insulating material is disposed on the outer surfaces of the trench.

24. The method of claim 19 wherein forming a trench around at least a portion of the contact further includes anisotropically etching, through the first and second encapsulation layers, to an insulating material.

25. The method of claim 19 further including forming the chamber, wherein forming the chamber includes:

depositing a sacrificial layer over at least a portion of the micromechanical structure;

depositing the first encapsulation layer over the sacrificial layer; and removing at least a portion of the sacrificial layer.

26. The method of claim 25 wherein forming the chamber further includes:

forming at least one vent through the first encapsulation layer to allow removal of at least the portion of the sacrificial layer; and depositing the second encapsulation layer over or in the vent to seal the chamber.

27. The method of claim 19 wherein depositing an insulating material in the trench further includes depositing the insulating material substantially throughout the trench.

* * * * *